(12) United States Patent
Lovejoy

(10) Patent No.: US 12,709,784 B2
(45) Date of Patent: Aug. 18, 2026

(54) SOLVENT FREE COPPER EXTRACTION

(71) Applicant: Greensource Fabrication LLC, Charlestown, NH (US)

(72) Inventor: Derek Lovejoy, Milford, NH (US)

(73) Assignee: Greensource Fabrication LLC, Charlestown, NH (US)

( * ) Notice: Subject to any disclaimer, the term of this patent is extended or adjusted under 35 U.S.C. 154(b) by 0 days.

(21) Appl. No.: 19/002,975

(22) Filed: Dec. 27, 2024

(65) Prior Publication Data

US 2025/0220820 A1 Jul. 3, 2025

Related U.S. Application Data

(60) Provisional application No. 63/616,120, filed on Dec. 29, 2023.

(51) Int. Cl.
*C22B 3/42* (2006.01)
*B01J 47/14* (2017.01)
(Continued)

(52) U.S. Cl.
CPC ................. *C22B 3/42* (2013.01); *B01J 47/14* (2013.01); *B09B 3/40* (2022.01); *B09B 3/70* (2022.01);
(Continued)

(58) Field of Classification Search
CPC ......... C22B 3/42; C22B 7/00; C22B 15/0063; C22B 15/0089; B01J 47/14; B09B 3/40;
(Continued)

(56) References Cited

U.S. PATENT DOCUMENTS 4,060,447 A * 11/1977 Nelson ...................... C23F 1/00 216/106
4,280,904 A * 7/1981 Carlson ............... C22B 60/0265 210/189
(Continued)

FOREIGN PATENT DOCUMENTS

| | | | |
|---|---|---|---|
| EP | 0 458 119 | | 11/1991 |
| JP | 2013181219 A | * | 9/2013 |

OTHER PUBLICATIONS

Ajiboye; Sep. 2023; "Selective Recovery of Copper from the Mixed Metals Leach Liquor of E-Waste Materials by Ion-Exchange: Batch and Column Study", Minerals (Year: 2023).*
(Continued)

*Primary Examiner* — Ryan J. Walters
(74) *Attorney, Agent, or Firm* — HOGAN LOVELLS CADWALADER US LLP

(57) ABSTRACT

The system and method described herein provides a system and method for using ion-exchange resins to remove excess copper during processes such as PCB (Printed Circuit Board) fabrication using cupric chloride etchants. $Cu^{+2}$ is used to oxidize solid copper producing two $Cu^{+}$ ions. During operation, the etchant is overloaded with copper ions and an extraction system is implemented to control the concentration and remove excess copper. Traditional systems use liquid extractions but these systems can be costly and use hazardous solvents. Ion-exchange resins serve as a solution for controlling the concentration, absorbing metal ions and retaining them until desorption. The system and method further determines the effectiveness of the resin in removing the copper based on performing adsorption and desorption at varying flow rates. The results showed that the resin effectively removes copper at various flowrates, removing an
(Continued)

average of 10.06 g/l Cu from a bulk value of three beds of etchant.

13 Claims, 30 Drawing Sheets

(51) Int. Cl.

| | |
|---|---|
| ***B09B 3/40*** | (2022.01) |
| ***B09B 3/70*** | (2022.01) |
| ***B09B 3/80*** | (2022.01) |
| ***C22B 7/00*** | (2006.01) |
| ***C22B 15/00*** | (2006.01) |
| ***C23F 1/46*** | (2006.01) |
| *B09B 101/17* | (2022.01) |
| *C23G 1/36* | (2006.01) |
| *H05K 3/06* | (2006.01) |

(52) U.S. Cl.
CPC .................. *B09B 3/80* (2022.01); *C22B 7/00* (2013.01); *C22B 15/0063* (2013.01); *C22B 15/0089* (2013.01); *C23F 1/46* (2013.01); *B09B 2101/17* (2022.01); *C23G 1/36* (2013.01); *H05K 3/067* (2013.01); *H05K 2203/178* (2013.01)

(58) Field of Classification Search
CPC ......... B09B 3/70; B09B 3/80; B09B 2101/17; C23F 1/46; C23G 1/36; H05K 3/067; H05K 2203/178
See application file for complete search history.

(56) References Cited

U.S. PATENT DOCUMENTS

| | | | | |
|---|---|---|---|---|
| 4,500,396 | A * | 2/1985 | D'Agostino | B01J 47/127 423/DIG. 14 |
| 6,379,551 | B1 * | 4/2002 | Lee | C08J 5/225 210/651 |
| 11,767,239 | B2 * | 9/2023 | Kobayashi | B01J 47/019 210/252 |

OTHER PUBLICATIONS

International Search Report and Written Opinion issued in related PCT Application No. PCT/US2024/062016.

* cited by examiner

Table 1. Testing Overview

| | Adsorption | | | Desorption | | |
|---|---|---|---|---|---|---|
| Flow Class. | Test No. | | Target Flow Rate [1/Hr] | Test No. | | Target Flow Rate [1/Hr] |
| Low | 1 | | 5 | 2 | | 2 |
| Mid-Low | 3 | | 10 | 4 | | 6.5 |
| Mid | 5 | | 15 | 6 | | 11 |
| Mid-High | 7 | | 20 | 8 | | 15.5 |
| High | 9 | | 25 | 10 | | 20 |
| Low | 11 | | 5 | 12 | | 2 |
| Mid-Low | 13 | | 10 | 14 | | 6.5 |
| Mid | 15 | | 15 | 16 | | 11 |
| Mid-High | 17 | | 20 | 18 | | 15.5 |
| High | 19 | | 25 | 20 | | 20 |
| Mid-Low | 21 | | 10 | 22 | | 6.5 |
| Mid | 23 | | 15 | 24 | | 11 |
| Mid-High | 25 | | 20 | 26 | | 15.5 |
| Mid | 27 | | 15 | 28 | | 11 |

Table 4. Desorption Time

| Flow Class | Test No. | Target Flow Rate [1/Hr] | Flow Rate [1/Hr] | Flow Rate [BV/Hr] | Feed Cu. [g/l] | End Cu. [g/l] | Required Time [min] |
|---|---|---|---|---|---|---|---|
| Low | 2 | 2 | 1.96 | 2.16 | 13.343 | 18.109 | 37 |
| | 12 | | 2.11 | 2.33 | 20.968 | 24.781 | |
| Mid-Low | 4 | 6.5 | 6.46 | 7.13 | 18.585 | 23.51 | 12.5 |
| | 14 | | 5.12 | 5.65 | 25.416 | 30.182 | 14.6 |
| | 22 | | 5.53 | 6.10 | 26.051 | 29.864 | 15.5 |
| Mid | 6 | 11 | 10.83 | 11.95 | 25.098 | 30.817 | 7.9 |
| | 16 | | 11.54 | 12.74 | 15.250 | 18.268 | 7.9 |
| | 24 | | 9.73 | 10.74 | 31.293 | 35.265 | 9.55 |
| | 28 | | 9.48 | 10.46 | 40.983 | 47.02 | 10.9 |
| Mid-High | 8 | 15.5 | 15.20 | 16.78 | 13.026 | 16.838 | 5.7 |
| | 18 | | 16.18 | 17.86 | 18.427 | 21.604 | 6.8 |
| | 26 | | 15.14 | 16.71 | 35.582 | 40.666 | 7.52 |
| High | 10 | 20 | 21.42 | 23.64 | 17.315 | 20.651 | 5.25 |
| | 20 | | 20.88 | 23.05 | 22.239 | 25.734 | 5.55 |

| | Adsorption | | | Desorption | | |
|---|---|---|---|---|---|---|
| Flow Class. | Test No. | Test Date | Target Flow Rate [l/Hr] | Test No. | Test Date | Target Flow Rate [l/Hr] |
| Low | 1 | 6/20/2022 | 5 | 2 | 6/21/2022 | 2 |
| Mid-Low | 3 | 6/22/2022 | 10 | 4 | 6/23/2022 | 6.5 |
| Mid | 5 | 6/24/2022 | 15 | 6 | 6/27/2022 | 11 |
| Mid-High | 7 | 6/28/2022 | 20 | 8 | 6/29/2022 | 15.5 |
| High | 9 | 6/30/2022 | 25 | 10 | 7/1/2022 | 20 |
| Low | 11 | 7/5/2022 | 5 | 12 | 7/6/2022 | 2 |
| Mid-Low | 13 | 7/7/2022 | 10 | 14 | 7/8/2022 | 6.5 |
| Mid | 15 | 7/11/2022 | 15 | 16 | 7/12/2022 | 11 |
| Mid-High | 17 | 7/13/2022 | 20 | 18 | 7/14/2022 | 15.5 |
| High | 19 | 7/18/2022 | 25 | 20 | 7/19/2022 | 20 |
| Mid-Low | 21 | 7/20/2022 | 10 | 22 | 7/21/2022 | 6.5 |
| Mid | 23 | 7/22/2022 | 15 | 24 | 7/25/2022 | 11 |
| Mid-High | 25 | 7/26/2022 | 20 | 26 | 7/27/2022 | 15.5 |
| Mid | 27 | 7/28/2022 | 15 | 28 | 7/29/2022 | 11 |

FIG. 15

Table 2. Summary of Copper and pH fits for Adsorption Data

| Test No. | Target Flow Rate [l/Hr] | Flow Rate [l/Hr] | Feed Copper Concentration [g/l] | Effluent Copper Fit $R^2$ | Bulk Copper Fit $R^2$ | Effluent pH Fit $R^2$ |
|---|---|---|---|---|---|---|
| 1 | 5 | 5.32 | 111.893 | 0.9760 | 0.9894 | 0.9987 |
| 11 | | 4.40 | 109.297 | 0.9771 | 0.9754 | 0.9782 |
| 3 | 10 | 10.50 | 113.11 | 0.9850 | 0.9814 | 0.9975 |
| 13 | | 8.69 | 110.568 | 0.9790 | 0.9918 | 0.9990 |
| 21 | | 9.01 | 99.130 | 0.9880 | 0.9587 | 0.9979 |
| 5 | 15 | 15.59 | 111.839 | 0.9850 | 0.9852 | 0.9915 |
| 15 | | 14.38 | 105.485 | 0.9920 | 0.9848 | 0.9975 |
| 23 | | 15.20 | 99.130 | 0.9942 | 0.9474 | 0.9998 |
| 27 | | 15.07 | 92.776 | 0.9794 | 0.9809 | 0.9985 |
| 7 | 20 | 21.00 | 106.756 | 0.9846 | 0.9869 | 0.9989 |
| 17 | | 21.84 | 106.756 | 0.9945 | 0.9942 | 0.9969 |
| 25 | | 22.40 | 96.588 | 0.9940 | 0.9599 | 0.9955 |
| 9 | 25 | 25.80 | 114.381 | 0.9944 | 0.9971 | 0.9978 |
| 19 | | 28.89 | 100.401 | 0.9950 | 0.9926 | 0.9970 |

FIG. 20

Table 3. Amounts of Copper Removed from 1BV to 6BV of Etch.

| Test No. | Target Flow Rate [1/Hr] | Flow Rate [1/Hr] | Feed [Cu] | ΔCu [1BV] | ΔCu [2BV] | ΔCu [3BV] | ΔCu [4BV] | ΔCu [5BV] | ΔCu [6BV] |
|---|---|---|---|---|---|---|---|---|---|
| 1 | 5 | 5.32 | 111.893 | 18.915 | 11.366 | 8.620 | 7.200 | 6.332 | 5.747 |
| 11 | | 4.40 | 109.297 | 13.971 | 8.359 | 6.489 | 5.553 | 4.992 | 4.618 |
| 3 | 10 | 10.50 | 113.110 | 23.467 | 13.270 | 9.722 | 7.918 | 6.827 | 6.095 |
| 13 | | 8.69 | 110.568 | 22.832 | 12.775 | 9.423 | 7.746 | 6.741 | 6.070 |
| 21 | | 9.01 | 99.130 | 15.121 | 8.896 | 6.821 | 5.783 | 5.160 | 4.745 |
| 5 | 15 | 15.59 | 111.839 | 31.861 | 16.995 | 12.040 | 9.562 | 8.076 | 7.085 |
| 15 | | 14.38 | 105.485 | 23.387 | 13.285 | 9.917 | 8.233 | 7.223 | 6.550 |
| 23 | | 15.20 | 99.130 | 18.931 | 10.854 | 8.147 | 6.790 | 5.976 | 5.432 |
| 27 | | 15.07 | 92.776 | 15.650 | 9.246 | 7.102 | 6.029 | 5.384 | 4.954 |
| 7 | 20 | 21.00 | 106.756 | 30.908 | 16.333 | 11.451 | 9.005 | 7.536 | 6.556 |
| 17 | | 21.84 | 106.756 | 25.975 | 18.225 | 14.396 | 12.113 | 10.597 | 9.517 |
| 25 | | 22.40 | 96.588 | 20.968 | 12.047 | 9.072 | 7.584 | 6.691 | 6.096 |
| 9 | 25 | 25.80 | 114.381 | 26.792 | 19.539 | 15.759 | 13.438 | 11.869 | 10.737 |
| 19 | | 28.89 | 100.401 | 24.501 | 15.686 | 11.810 | 9.631 | 8.235 | 7.264 |
| | | | Avg. | 22.377 | 13.348 | 10.055 | 8.328 | 7.260 | 6.533 |
| | | | Stdev. | 5.523 | 3.547 | 2.766 | 2.292 | 1.970 | 1.737 |

FIG. 21

Table 4. Desorption Time

| Flow Class | Test No. | Target Flow Rate [l/Hr] | Flow Rate [l/Hr] | Flow Rate [BV/Hr] | Feed Cu. [g/l] | End Cu. [g/l] | Required Time [min] |
|---|---|---|---|---|---|---|---|
| Low | 2 | 2 | 1.96 | 2.16 | 13.343 | 18.109 | 37 |
| | 12 | | 2.11 | 2.33 | 20.968 | 24.781 | |
| Mid-Low | 4 | 6.5 | 6.46 | 7.13 | 18.585 | 23.51 | 12.5 |
| | 14 | | 5.12 | 5.65 | 25.416 | 30.182 | 14.6 |
| | 22 | | 5.53 | 6.10 | 26.051 | 29.864 | 15.5 |
| Mid | 6 | 11 | 10.83 | 11.95 | 25.098 | 30.817 | 7.9 |
| | 16 | | 11.54 | 12.74 | 15.250 | 18.268 | 7.9 |
| | 24 | | 9.73 | 10.74 | 31.293 | 35.265 | 9.55 |
| | 28 | | 9.48 | 10.46 | 40.983 | 47.02 | 10.9 |
| Mid-High | 8 | 15.5 | 15.20 | 16.78 | 13.026 | 16.838 | 5.7 |
| | 18 | | 16.18 | 17.86 | 18.427 | 21.604 | 6.8 |
| | 26 | | 15.14 | 16.71 | 35.582 | 40.666 | 7.52 |
| High | 10 | 20 | 21.42 | 23.64 | 17.315 | 20.651 | 5.25 |
| | 20 | | 20.88 | 23.05 | 22.239 | 25.734 | 5.55 |

FIG. 29

SOLVENT FREE COPPER EXTRACTION

CROSS-REFERENCE TO RELATED APPLICATIONS

This application claims priority to U.S. Provisional Application No. 63/616,120, filed Dec. 29, 2023, the entirety of which is incorporated herein by reference.

FIELD OF THE INVENTION

This invention relates to a system and method for controlling the concentration of copper in etchants, and in particular to using ion-exchange resins to absorb copper ions during acidic etching. Moreover, any copper ions absorbed by the resin during the etching process can be recovered through desorption.

BACKGROUND OF THE INVENTION

Solvent extraction techniques are known to be applied for the recovery of metals and used in large scale production of metals. Solvents are used for the extraction specifically of copper from solutions of varying pH values. This leaching of the copper can change based on the pH values of solutions. When dissolved as ions in water, metals can be highly hazardous to human and environmental health. Separation of specific metals are critical to efficient metal product and environmental management. Liquid-liquid extraction is the most common traditional method for selective separations of metals but it requires hazardous and environmentally detrimental organic solvents. Other traditional systems for extracting excess copper ions may rely on direct plating methods, which can generate fugitive gases such as chlorine gas.

Solvent extraction techniques may be applied during the fabrication of Printed Circuit Boards (PCBs), where etching is required to remove unwanted or excess amount of materials, such as copper, from a substrate so that only copper forming the desired circuit remains. One common type of etching is chemical etching, which relies on removing a substance, such as copper, by using a liquid reactant such as cupric chloride, to accurately etch of features of a PCB. To control the concentration of copper, an extraction system is implemented to remove excess copper. Acidic cupric chloride etching systems have become common in Printed Circuit Board (PCB) fabrication. The cupric chloride etchants used to remove copper in PCB fabrication use $Cu^{+2}$, an ion of copper carrying a double positive chart, to oxidize solid copper on the PCB substrate. This etching produces two Cut ions, and during the etching operation, the etchant can become overloaded with these copper ions. However, these systems use liquid-liquid extractions which can be costly, use hazardous solvents, and produce hazardous waste including during replacing of organic solvents.

For example, Acidic cupric chloride etching systems use cupric copper ($Cu^{2+}$) to oxidize and dissolve solid copper, thus producing two cuprous copper ($Cu\mathbf{1}^{+}$) ions in solution, as shown in Equation 1.

Etching Process — Equation 1

$$Cu^{2+} + Cu^{0} \rightarrow 2Cu^{1+}$$

Further, Cupric copper is regenerated by oxidizing cuprous copper, which allows etching to continue (Equation 2).

Cupric Regeneration — Equation 2

$$2Cu^{1+} + 0.5O_2 + 2H^{+} \rightarrow 2Cu^{2+} + H_2O$$

While electrowinning copper from the etchant is possible, the process is extremely hazardous as it releases chlorine gas. PCB fabricators, therefore, rely on liquid-liquid extraction (LLE) units for extraction. The process begins with mixing copper heavy etchant with an immiscible organic solvent. The solvent strips copper ions from the etchant, the etchant/organic mix is then settled, and the two liquid phases are separated. The regenerated etchant is returned to the etcher while the copper heavy organic solvent moves to the next extraction unit. The copper heavy organic solvent is mixed with an immiscible acid electrolyte which strips the copper from the solvent, thus regenerating the solvent. The immiscible liquids are allowed to settle and are separated, with the regenerated organic solvent cycling back to be mixed with the etchant again. The acid electrolyte then moves to an electrowinning cell, where the copper is plated out of the solution, thus regenerating the acid electrolyte. This process requires a minimum of two LLE mixer or settler units, though multiple counter current extractors are often needed to remove adequate amounts of copper.

Despite being common for etchant regeneration, liquid-liquid extraction is flawed in several ways. First, these systems use large quantities of hazardous and expensive organic solvent which must be dosed frequently and eventually replaced. The organic solvent poses an environmental hazard and cannot be treated using traditional waste treatment systems found in PCB factories. This means the fabricator will have a hazardous waste stream upon disposal of the solvent. Secondly, the LLE systems require a large amount of floor space and use hundreds of gallons of chemicals to operate. Third, liquid-liquid extraction systems can be prone to mishaps. Cross contamination of liquids such as the organic solvent in the regenerated etchant tank can result in a breakdown of the system which can shut down the etching line for days.

Thus, a need exists for improved methods to remove a copper from a volume of etchant without using costly and hazardous ingredients, such as organic solvents.

SUMMARY OF THE INVENTION

The purpose and advantages of the present invention will be set forth in and apparent from the description that follows. Additional advantages of the invention will be realized and attained by methods and system particularly pointed out in the written description and claims hereof, as well as from the drawings.

The present invention is directed to a system and method that use ion-exchange resins to remove excess copper, with the resins adsorbing metal ions and retaining them until desorption is applied. Ion-exchange is a separation method in which a solid phase adsorbent captures a desired ion from a fluid and replaces it with a less desired ion of the same charge. Ion-exchange resins are frequently used for recovery of metals from process waste streams. A study for effectiveness was performed using a small-scale column where adsorption and desorption were performed with varying flow rates. The results showed that this ion-exchange resin effectively removes copper at various flowrates. The extraction process with the ion-exchange resin further proves to be environmentally friendly, minimizing waste, for example, by only wasting copper plates. extracting copper from etchant, such as, cupric chloride etchants overloaded with copper ions. To control the concentration, an extraction system is implemented to remove excess copper. Ion-exchange resins serve as a solution for controlling the concentration, absorbing metal ions and retaining them until desorption. The system and method further determines the effectiveness of the resin in removing the copper based on performing adsorption and desorption at varying flow rates.

The system and method uses an ion-exchange resin to remove a significant amount of copper form a volume of etchant without using costly and hazardous organic solvents. The amount of copper that can be removed from the etchant is a function of 1) the volume of etchant treated and/or the column size and 2) the specific initial mass flow rate of copper through the column. The etchant and resin are treated through an adsorption and desorption process for the extraction using an ion-exchange resin and a resin column. Adsorption and desorption were performed at varying flow rates to determine the effectiveness of the resin in removing copper. Desorption of the copper from the resin uses sulfuric acid electrolyte. The process described herein provides a solution to the traditional LLE systems which use hazardous organic solvents to extract copper ions from etchants and release hazardous gases during the treatment process. An ion-exchange resin is used providing a non-hazardous solid, which can be disposed of without causing environmental harm. This proves to be advantageous with respect to the use of solvent free copper extraction using ion-exchange resins. Resin columns are used and have a much smaller footprint than LLE mixer and/or settler, thus gaining area which can be used for other processes. Resin columns can also eliminate the risk of cross contamination between fluids because the etchant and acid electrolyte are not used at the same time, while the LLE units operate with two liquids contacting at once. Thus, the risk of cross contamination in the resin column is reduced by using water rinses, air purging and discarding diluted liquid. Even if cross contamination were to occur in the present system, due to a valve failure for example, the subsequent waste treatment system would be able to handle the generated waste because the organic phase would be eliminated, i.e., only aqueous solutions would be present. Furthermore, whereas conventional methods focus on removing all ions in the cleaning processor, the process described herein focuses instead on removing only a targeted number of ions to keep the overall chemistry of the system within certain control limits. Thus, the present systems and processes save time and improve overall efficiency in the cleaning process. Furthermore, the resin systems described herein are modular, i.e., the resin system can be assembled in many different configurations. Thus, the present systems may take up less space compared to conventional LLE systems.

As such, the solvent free copper extraction process and system described herein provides a safe and efficient solution for metal extraction techniques.

BRIEF DESCRIPTION OF THE DRAWINGS

FIG. 7 illustrates a table describing the testing plan for desorption and adsorption with varying flow rates.

FIG. 12 illustrates a table with desorption times based on target flow rates.

FIG. 15 illustrates a table describing results with respect to the adsorption process and desorption process.

FIG. 20 illustrates table describing copper and pH fits for adsorption data.

FIG. 21 illustrates a table describing the mounts of copper removed from 1BV to 6BV of etchant.

FIG. 29 illustrates a table describing desorption time with regard to flow rate.

DETAILED DESCRIPTION OF THE INVENTION

The description herein is directed to a process and apparatus for removing copper ions from etchant, for example, acidic cupric etchant using an ion-exchange resin. Ion-exchange resins are non-hazardous solids, thus allowing them to be easily disposed when necessary. Resin systems also eliminate the need for organic solvents. The system and method include an apparatus to perform an adsorption process and desorption process. A column may be provided having a certain volume, and may be packed with a commercially available ion-exchange resin that favors adsorption of copper ions at low pH. The column may not be fully packed, so as to allow for expansion and compaction. The resin can remove a significant amount of copper from a volume of etchant, at times, the volume of the etchant being larger than the volume of the resin. The process further avoids using costly and hazardous organic solvents. The amount of copper that can be removed from the etchant is a function of 1) the volume of etchant treated and/or column size and 2) the specific initial mass flow rate of copper through the column. For etchant treatment, the copper ions are adsorbed by the resin which release protons into the etchant to maintain charge balance. Once the resin is full, the copper ions are removed from the resin with a sulfuric acid electrolyte which desorbs the copper and leaves protons behind in the resin. Equations 3-6 further capture this process of adsorption and desorption. In the equations, the $R_n$ term which represents the resin, which can have a charge of, for example, −2.

Adsorption of Cupric Copper Equation 3

$$Cu^{2+} + H_2R_n \rightarrow CuR_n + 2H^+$$

Adsorption of Cuprous Copper Equation 4

$$2Cu^{+} + H_2R_n \rightarrow Cu_2R_n + 2H^+$$

Desorption of Cupric Copper Equation 5

$$CuR_n + H_2SO_4 \rightarrow H_2R_n + CuSO_4$$

Desorption of Cuprous Copper Equation 6

$$Cu_2R_n + H_2SO_4 \rightarrow H_2R_n + Cu_2SO_4$$

Figure 1:
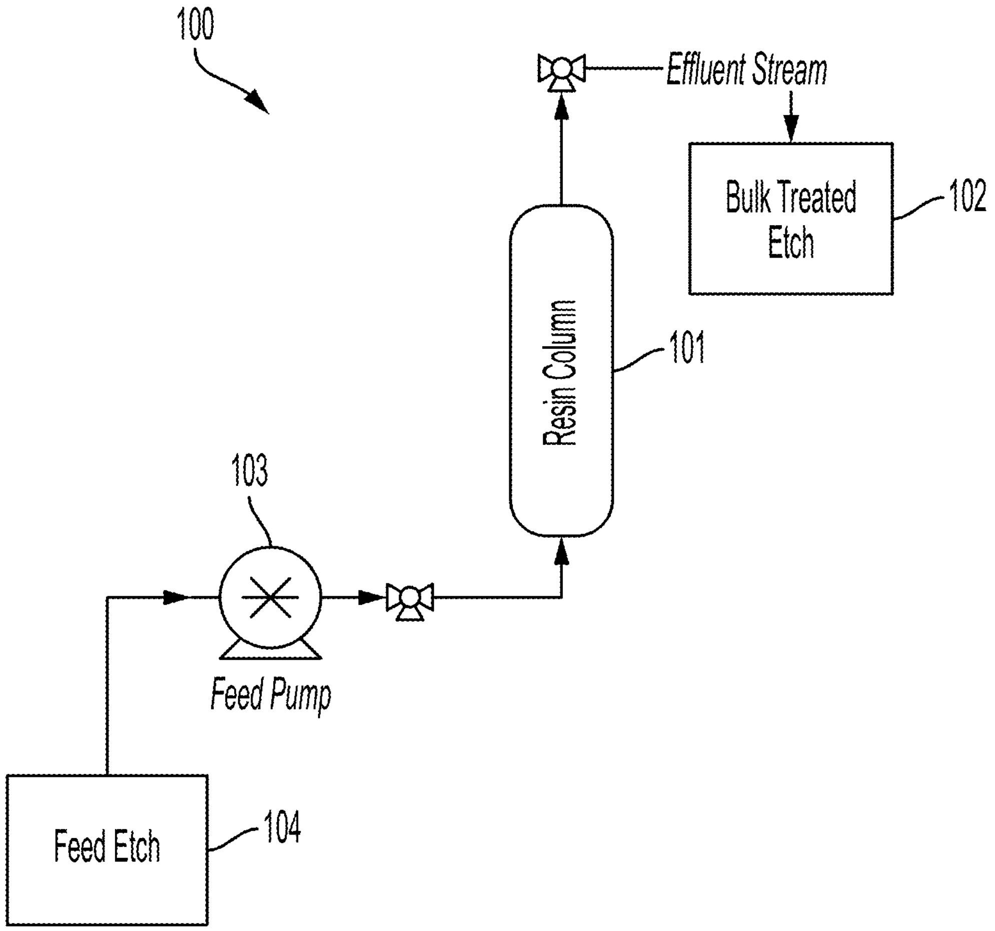
FIG. 1 illustrates an apparatus that carries out the adsorption process.
Figure 3:
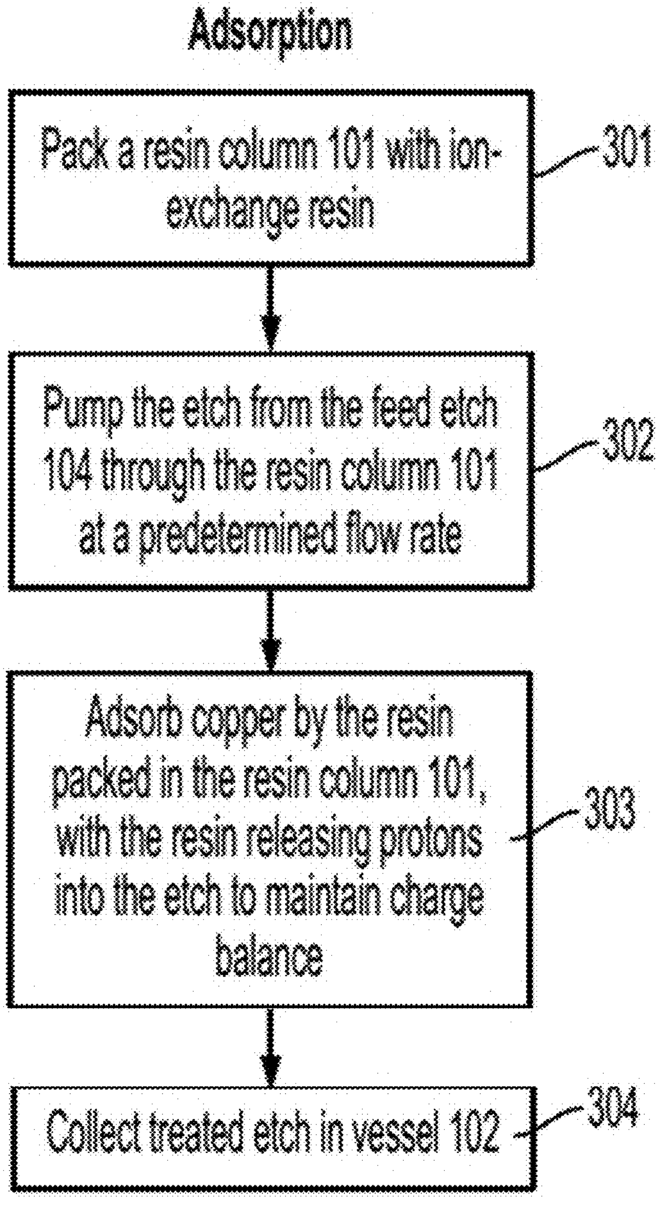
FIG. 3 illustrates a flowchart describing the adsorption process.

FIG. 1 depicts an exemplary apparatus carrying out the adsorption process of the ion exchange resin system and method (shown in FIG. 3), using a resin column 101. The internal volume of the resin column 101 can vary in size. During the adsorption process, the column is capable of being packed with, for a commercially available ion-exchange resin, for instance, storing approximately 0.906 liters of the ion-exchange resin (Step 301). The apparatus 100 is equipped with a pump 103 to move liquids through the vertically mounted resin column 101. The etch, for example, is pumped from a feed etch 104 through the resin column 101 at a predetermined flow rate (Step 302). During adsorption, the treated etchant is collected into a second vessel 102 (Step 304). The etchant is initially stored in the feed etch 104 and fed through the feed pump 103 through the resin column 102 based on a predetermined flow rate. The column is packed with the commercially available ion-exchange resin but not completely packed with the resin such as to allow for expansion and contraction during testing. The apparatus 100 is further equipped with a small pump to move liquids through the vertically mounted resin column 101 at a predetermined flow rate. During this adsorption process, the copper, for example, copper ions, are adsorbed by the resin packed in the resin column 102, with the resin releasing protons into the etchant to maintain the charge balance (Step 303). The resulting bulk treated etchant is collected into the bulk treated etch vessel 102 (Step 304).

Figure 2:
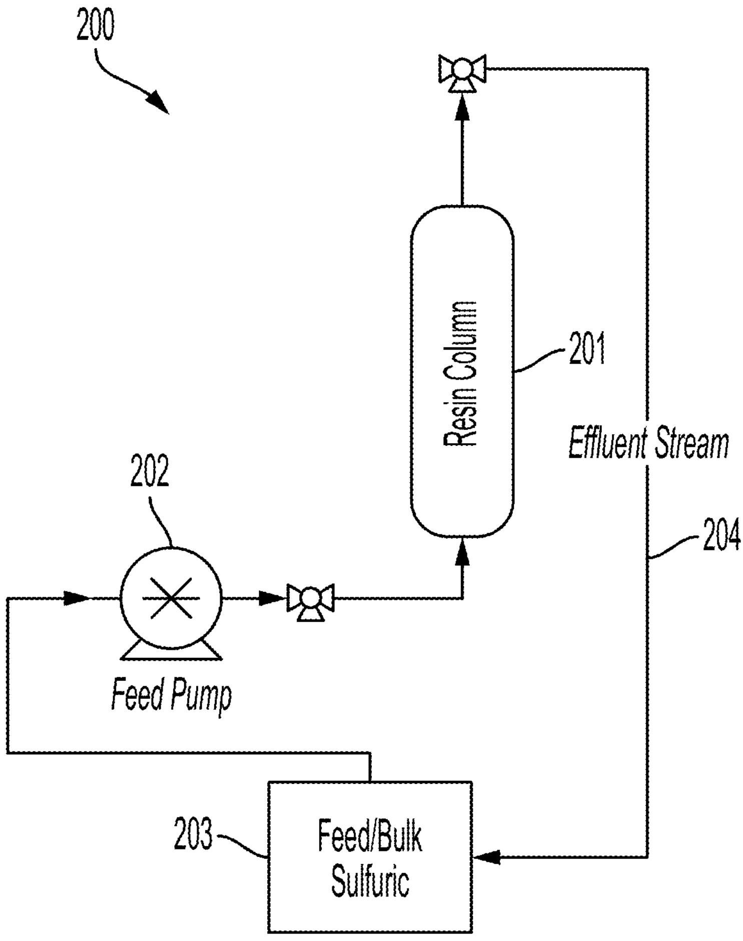
FIG. 2 illustrates an apparatus that carries out the desorption process.
Figure 4:
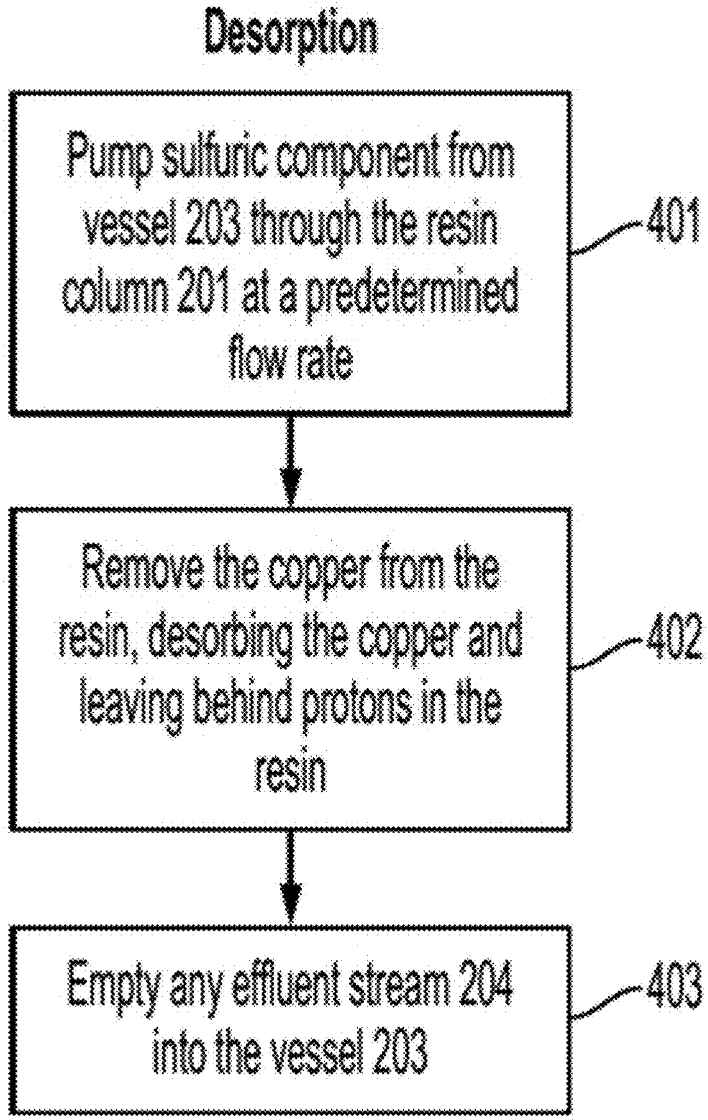
FIG. 4 illustrates a flowchart describing the desorption process.

FIG. 2 depicts an apparatus carrying out the desorption process of FIG. 4, where a sulfuric component is fed into the resin column 201 at a predetermined flow rate with the resin column 201 packed with the resin that has adsorbed the copper ions. The sulfuric component is fed from the vessel 203 through the resin column 201 at a predetermined flow rate (Step 401). The vessel 203 carries the sulfuric component with the sulfuric component pumped into the resin column 201 to desorb the copper. For instance, a sulfuric acid electrolyte stored in the vessel 203 is pumped through the resin column 201 holding the resin with the adsorbed copper ions. This results in the copper ions being removed from the resin with the sulfuric acid electrolyte, desorbing the copper and leaving behind the protons in the resin (Step 402). The process can also generate an effluent stream 204 which may be recycled back into the vessel 203 (Step 403). The apparatus of FIGS. 1 and 2 may be similar in nature but are described as separate tools carrying out each of the adsorption and desorption process. The apparatus of FIG. 1 and FIG. 2 can be further equipped with an air pump to purge the system of residual liquids in between experiments. Temperature and/or pH probes may also be attached to the effluent stream of the apparatus. The flow rates of the etch and effluent stream through the resin column can be varied and further serves as a function of determining the amount of copper that is removed.

Resin columns 101 and 201 have also proven to play an integral role in the adsorption and desorption process with respect to the extractions. Additionally, resin columns have a much smaller footprint than LLE mixers and/or settlers. Resin columns also eliminate the risks for cross contamination between fluids as the etchant and the acid electrolyte are not used at the same time, while LLE units rely on contact between two liquids at once. The risk of cross contamination in the resin column is further reduced by using water rinses, air purging, and discarding diluted liquid. As such the solvent free extraction process using resin columns described herein, proves to be advantageous over the traditional methods for extraction.

Figure 5:
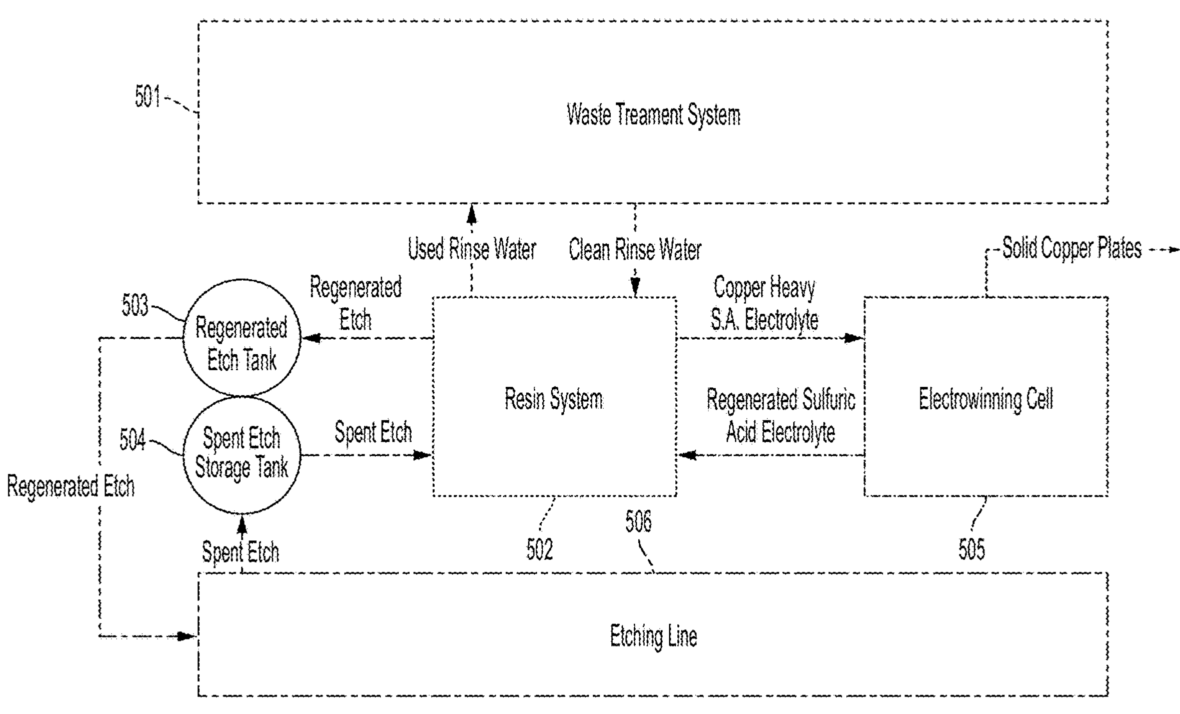
FIG. 5 illustrates a flowchart describing a water treatment and resin system.

FIG. 5 is a flowchart providing an overview of waste treatment and resin systems with respect to the adsorption and desorption process. A waste treatment system 501 may treat used rinse water received from the resin system 502, then return clean water back to the resin system 502. The resin system 502, electrowinning cell 505, and waste treatment system 501 may regenerate the etch received from an etch line 506 and one or more etch tanks 503 and 504. This etch may be stored in the regenerated etch tank 503 and later sent to the etch line 506. The etch line 506 transports spent etch to the spent etch storage tank 504 which in turn transports the spent etch to the resin system 502 where the process starts again.

In example embodiments, the system may utilize multiple beds of ion-exchange resin held within media tanks/columns such as a regenerated etch tank 503 and spent etch storage tank 504. The system may be configured such that one line of two tanks/columns 503 and 504 is capable of regenerating enough etch to maintain operation of etcher for one hour at maximum production rate. In other embodiments, the etch may maintain operation of etcher for some lesser or greater time, and any number of tanks/columns may be used. Once the first line including two tanks/columns 503 and 504 completes its treatment, that line then undergoes the regeneration process as described above. Regeneration may be achieved by treatment with a regeneration solution. In example embodiments, the regeneration solution may include without limitation an acid electrolyte comprised of $H_2SO_4$ and a mixture of copper sulfates. During regeneration within the resin system 502, protons from sulfuric acid received from the electrowinning cell 505 displace the copper ions which were captured by the resin from the spent etch storage tank 504 via the etching line 506. As a result, the resin is regenerated and sulfuric acid may be consumed. Following desorption, the copper may be removed from the sulfuric acid by means of electrowinning. During the electrowinning process performed by the electrowinning cell 505, water is broken at the anode (i.e., the positively charged electrode) which generates elemental oxygen, two protons, and two electrons. The electrons travel through an external circuit to the cathode (i.e., the negatively charged electrode) within the electrowinning cell 505 where the electrons are then react with the copper sulfate solution received from the resin system 502 resulting in the deposition of solid copper metal on the cathode. The protons then bind with the now free sulfuric anion, thus regenerating the sulfuric acid which was consumed during the desorption process. The regenerated sulfuric acid is then sent back to the resin system 502.

In other example embodiments, the cyclical operation process may include additional steps. As a nonlimiting example, there may be two or more water rinses performed by the waste treatment system 501 and four air purge steps. Additionally, an air pure step may be used to remove liquid from the tanks/columns 503 and 504, thus minimizing cross contamination and dilution of chemical baths. The water rinses further minimize the potential for cross contamination between the sulfuric electrolyte and the etching solution. In some example embodiments, some copper is stripped from the resin during the water rinse, due to the slightly acidic nature of deionized water. This copper may be later recovered in the main waste treatment process.

Figure 6A:
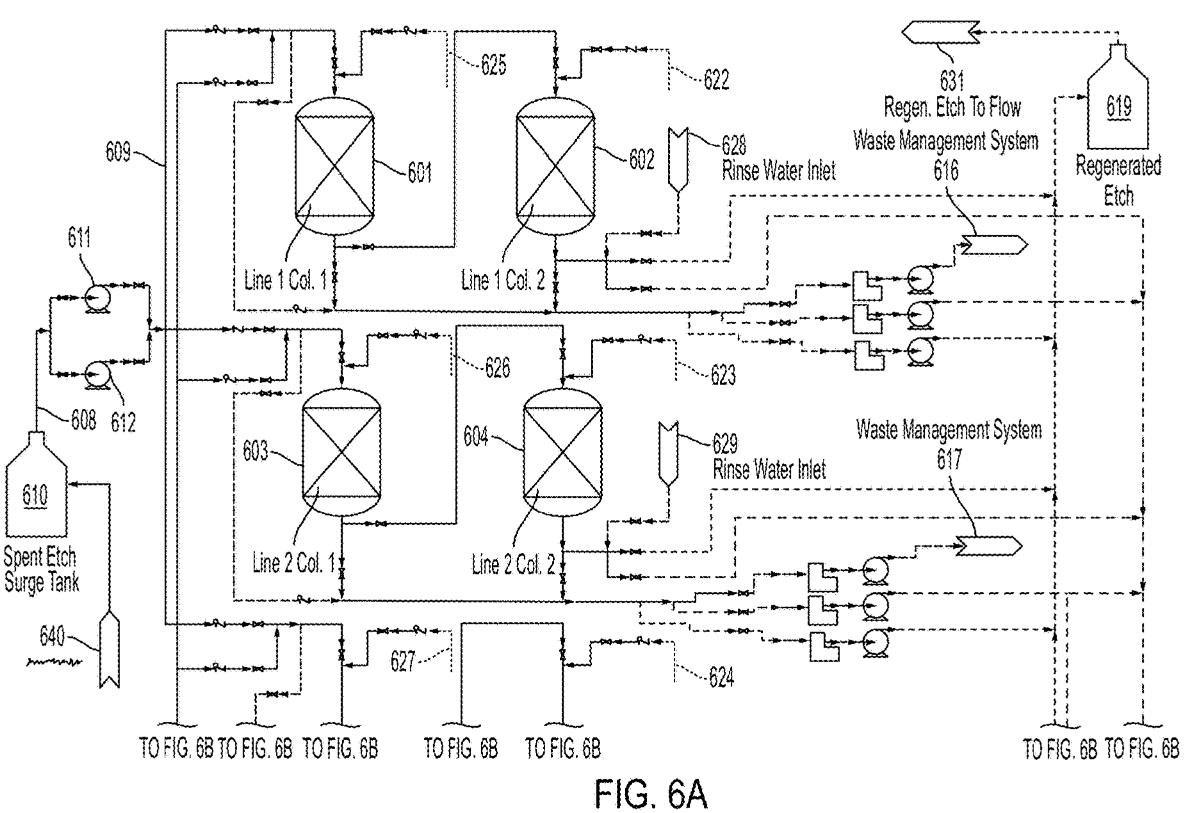
FIGS. 6A and 6B illustrate a system for performing the adsorption and desorption process.
Figure 6B:
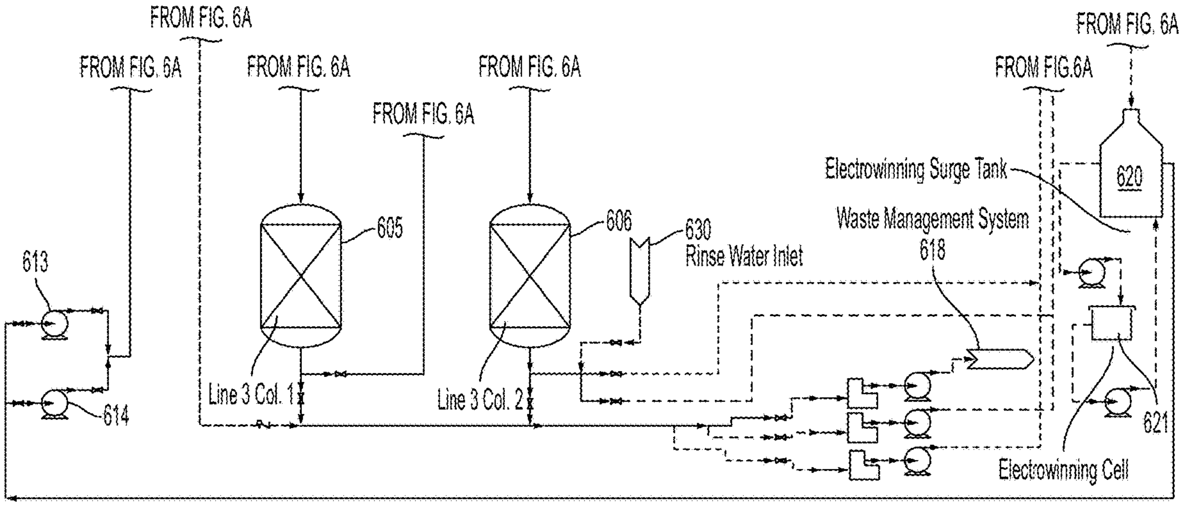

FIGS. 6A and 6B are system diagrams illustrating the media tanks and columns with respect to the adsorption process and desorption process illustrated with further reference to FIG. 5. In example embodiments, a system may include a plurality of media tanks or columns. These tanks and columns may be arranged in series or in parallel, and can be distributed throughout the system. For example, as shown in FIGS. 6A and 6B, a system may include six tanks or columns 601, 602, 603, 604, 605, and 606 each containing beds of ion-exchange resin. In other embodiments, the system can include greater or fewer tanks or columns. In the illustrated embodiment, the system uses a total of six columns which are arranged such that there are three parallel sets of two columns in series. Each column may hold a predetermined amount of resin such as, without limitation, eighteen cubic feet of IX resin, though other embodiments may hold more or less IX resin. The system may be configured such that one line of two columns is capable of regenerating enough etch to maintain operation of etcher for one hour at maximum production rate. In example embodiments, the system may be designed such that while one of the lines (e.g., tanks 601 and 602) is undergoing desorption/regeneration, another line (e.g., tanks 603 and 604) will be running the adsorption process. The third line (e.g., tanks 605 and 606) may be for redundancy purposes to enable full operation even while one of the lines is undergoing maintenance.

As shown in FIGS. 6A and 6B, spent etch 640 from an etcher may be provided to a spent etch surge tank 610. The spent etch from the spent etch surge tank 610 may then be directed to one or more columns, such as columns 601-606. The etch may be directed to these columns 601-606 through selective control of valves 611 and 612. In addition, there may be dedicated lines 608 and 609 that direct the etch from the spent etch surge tank 610 to the one or more columns 601- 606 containing resin. The output from the columns 601-606 may be selectively directed to one or more output destinations including one or more other columns, waste treatment systems 616, 617, and 618, a tank for holding regenerated etch 619, an electrowinning surge tank 620, or an electrowinning cell 621. The output may be directed to each of these destinations via one or more additional selectively controlled valves. The tank for holding regenerated etch 619 may periodically direct regenerated etch 631 to an etcher line or other etcher tank. Further, where the output is directed to an electrowinning surge tank 620, and output of this electrowinning surge tank 620 may be directed to an electrowinning cell 621. The electrowinning cell 621 may displace the copper ions which were captured by the resin and direct the regenerated liquid back to the columns 601-606 through selective control of valves 613 and 614. Moreover, each column may be associated with an air purges 622, 623, 624, 625, 626, and 627, which can direct air into any of the columns 601-606 in order to facilitate removal of excess liquid. Additional air purges may be included throughout the system. For example, following a step of treating etch in any of the resin columns 601-606 during the absorption process, the air purges 622-627 may be used to remove excess liquid once any of the columns 601-606 are fully saturated. The air purges 622-627 would facilitate removal of the saturated etch from the columns 601-606, with the saturated etch being directed to an etch tank. Before the output reaches an etch tank, it may be treated with water from a water rinse line 628, 629, and 630. When the output from any of the columns 601-606 will go to a waste outlet 616, 617, and 618, the air purges 622-627 may also be used to remove excess liquid which is then directed to a waste outlet. Further, during the desorption process, the air purges 622-627 may be used to remove the excess to an acid line, where it may be treated with rinse water from a water rinse lines 628, 629, and 630. Following this, the column may again be treated with the air purges 622-627 to remove excess liquid which is directed to a waste output 616, 617, and 618. Following this, the absorption process may start again, with the overall process repeating itself.

Although the tanks/columns as described in FIG. 5, 6A, and 6B as media columns, other tank/column embodiments may be used in different configurations of the present system. As nonlimiting examples, the system may used instead of or in addition to media columns: a packed bed reactor (PBR); a fluidized bed reactor (FBR); a packed or fluidized adsorption/stripping column configuration; an ion-exchange membrane (as opposed to an ion-exchange media bead); batch reactor (BR) or semi-batched reactor (SBR) or fed-batch reactors; continuous stirred tank reactor (CSTR); rotary drum or conveyer collection of resin beads; co-current or counter current flow reactor; specialized filter housing(s); continuous or batch mix-filter-mix style operation; and portable treatment systems for spot treatment.

FIG. 7 is a table providing an overview of the details and results of exemplary testing with respect to the adsorption process and desorption process. In particular, Table 5 shows the results fourteen adsorption tests and fourteen desorption tests. The fourteen adsorption tests were performed using five different flowrates 701 within the manufacturer's specification. The same number of desorption tests were run at five different flow rates 702. Unlike adsorption, four of the five desorption flow rates exceeded the manufacture's specification. The flow rates are classified into different categories based on the rate value, including flow classifications 703 described as, "Low", "Mid-Low", Mid ", "Mid-High" and "High". Other classifications pertaining to the flow rates may apply as well. Preliminary testing revealed that the resin could be regenerated faster at flow rates above the manufacture's specification. The speed of regeneration is critical to the effectiveness of the resin in a real application, therefore flow rates exceeding specification were of particular interest during testing. During adsorption and desorption testing, both effluent liquid leaving the column and bulk liquid collected in the column were gathered. Flow rates were determined by collecting effluent samples for a known time and measuring the volume of the collected liquid. Effluent temperature and pH values were recorded whenever an effluent sample was collected. In between tests, the column is air purged, rinsed with water and air purged again.

For adsorption, copper concentration, chloride concentration, pH, ORP (Oxidation-Reduction Potential), and specific gravity were measured for all samples. ORP is the ratio of $Cu^{2+}$ over $Cu^{1+}$. For desorption, copper concentration, chloride concentration, free acid concentration, sulfuric concentration, pH, and specific gravity were measured. The testing plan for the experiments are shown in Table 1 of FIG. 7. Preliminary testing revealed that even with an air purge, the resin still retained a large amount of water from the rinse cycle. This residual water caused the etchant and electrolyte to become diluted. To combat this, the first liquid that exited the column was discarded into a secondary vessel. The discard volume was measured for each test.

Figure 8:
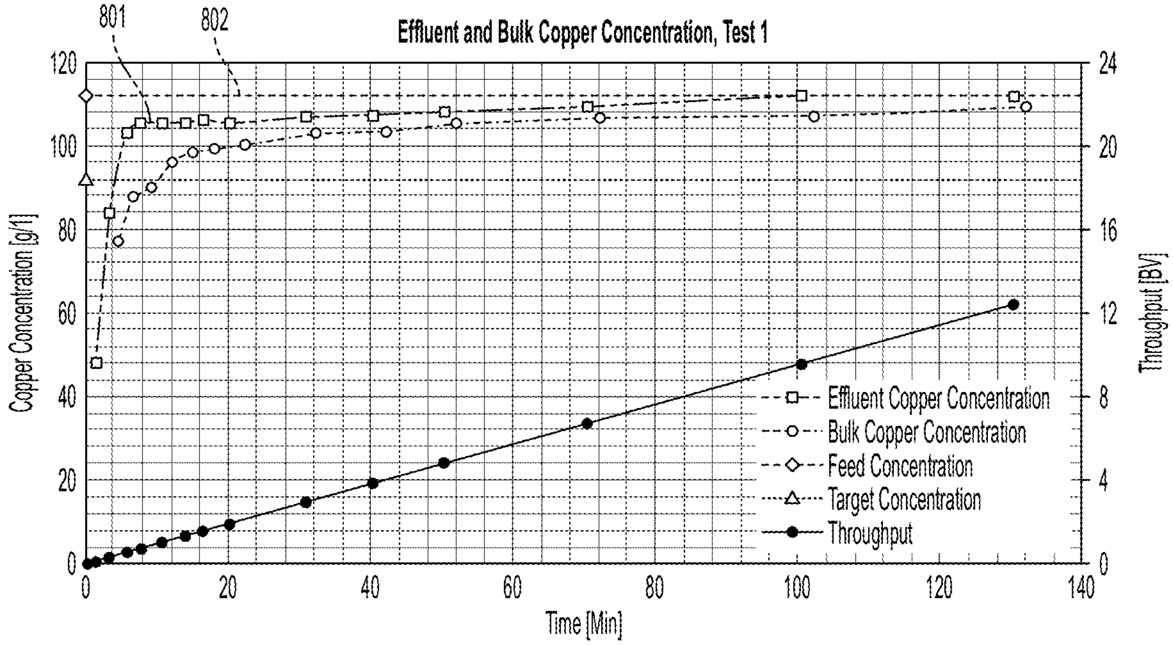
FIG. 8 illustrates a graph describing copper concentration levels associated with adsorption.
Figure 9:
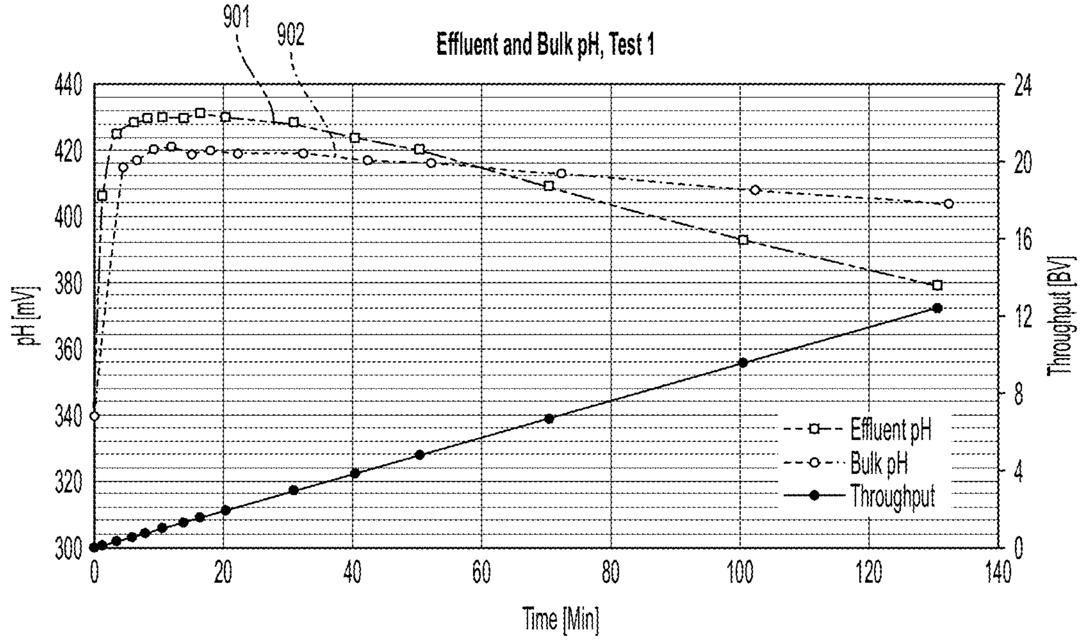
FIG. 9 illustrates a graph describing pH curves associated with pH levels during adsorption.

The adsorption test followed similar trends as shown in the copper curves of FIG. 8 which were repeated in each test with the only variation being the time it took to reach the breakthrough point, for example, with the effluent copper concentration 801 equaling the feed copper concentration 802. This graph chart describes the copper concentration during absorption with respect to the time associated with the throughput, and the breakthrough point, for example, a point at which the effluent copper concentration 801 equals the feed copper concentration 802. Chloride concentration dipped slightly, during initial adsorption before returning to near the feed condition, though chloride was not monitored as closely as other measurements due to limitations in lab testing. As shown in FIG. 9, pH data associated with the etch is also determined. The pH data depicted in the curves 901 and 902 are generally consistent across tests applying various flow rates during absorption. It is expected that as copper is removed from the etchant and replaced with protons as determined with Equations 3 and 4, the pH of the solution should increase drastically. This trend is generally applicable to most cases with respect to different flow rates. ORP was found to spike during initial adsorption in all tests except one. This spike in ORP suggests that the resin has a higher affinity for $Cu^{1+}$ than for $Cu^{2+}$. The ORP stabilized to near the feed condition as each test proceeded. Finally, the trend for specific gravity was consistent from test to test. It was expected that the specific gravity of the solution would drop due to the removal of the copper. The specific gravity drops by a significant amount before approaching the feed condition.

In additional, the temperature may be monitored to determine that the etchant cooled during adsorption in all monitored tests. The data collected indicates that throughput in bed volumes with respect to the volume of fluid that has passed through the column. A bed volume is dimensionless volume calculated with the Equation 7.

$$BV = \left[\frac{\text{Volume of Liquid [l]}}{\text{Resin Volume [l]}}\right] \quad \text{Equation 7}$$

The data of particular interest include, for example, the flow rates, the copper concentration as well as the pH levels. Equation 8 below, for example, is used to calculate the copper concentration data.

$$[\text{Cu}] = B - \left[\frac{K}{(t*M)+Z}\right] \quad \text{Equation 8}$$

Where: [Cu] is copper concentration, t is time in minutes, and B, K, M, and Z are constants The declining section of the effluent pH curve (901 of FIG. 9) were found to fit well to a linear equation. Additional data with respect to the summary of the copper and the pH fits are further discussed below.

Fit equations for bulk copper concentration were used to calculate for approximations of amounts of copper that should be removed from different bulk volumes of etch. The results of these calculations, based on varying flow rates determined the feed copper concentration and amounts of copper to be removed determined and associated based on the flow rate and with respect to a volume of the etch. An average and standard deviation of these measured values were evaluated to determine the amount of copper removed verses the throughput.

These test results indicate that different amounts of copper can be removed from etchant even if the same amount of etchant is treated. These differences can attribute to 1) different volumetric flow rates through the resin and 2) different feed copper concentration. In an ideal testing situation, both the flow rate and the feed copper concentration would be controlled and varied, but as the etchant is drawn from an active process line, the feed concentrations varied. As a result, the experimenters adjusted only the flow rate of etch during the experiments. Copper removed from the bulk was compared to volumetric flow rate, feed copper concentration, and specific inlet mass flow rate of copper. The specific inlet mass flow rate of copper calculated by Equation 9, takes volumetric flow rate, resin volume, and feed copper concentration into account.

$$\dot{M} = \left[\frac{\text{Feed Concentration}\left[\frac{\text{g}}{\text{l}}\right]*\text{Volumetric Flow Rate}\left[\frac{1}{\text{Hr}}\right]}{1000\left[\frac{\text{g}}{\text{kg}}\right]*\text{Resin Volume [l]}}\right] \quad \text{Equation 9}$$

Figure 10:
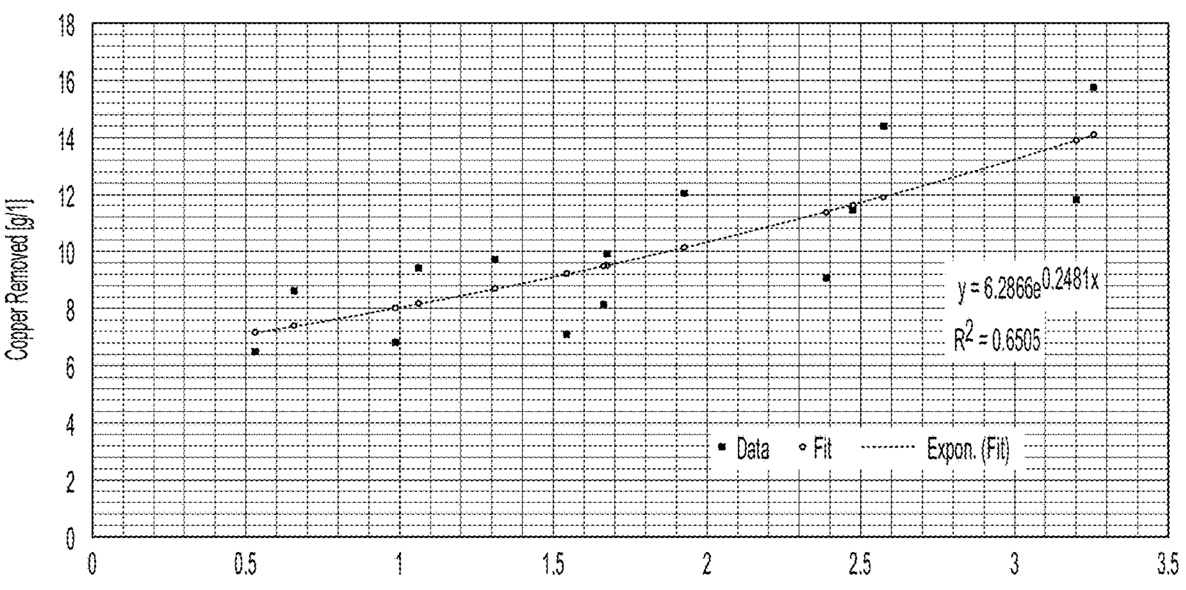
FIG. 10 illustrates a graph depicting amount of copper removed with respect to the specific mass flow rate at 3BV of throughput.

The data was found to fit best when compared to specific inlet mass flow rate for the three bed volumes of etchant processed. As the amount of processed etchant changes, data such as, copper removed and mass flow rate can change. The data collected corresponding to this, is depicted in the chart of FIG. 10, illustrates the amount of copper removed with respect to the mass flow rate at a specific volume of throughput. The graph of FIG. 10 further illustrates that increasing the feed copper concentration or flow rate will increase the amount of copper that can be pulled from the etchant (moving right on the graph of FIG. 10) while decreasing the feed copper concentration or flow rate will result in less copper being removed from the etchant (moving left on the graph of FIG. 10).

In addition, an analysis of the pH of the effluent stream can also be performed, in particular with measurement of interest to the experimenters for control purposes in a real system. The effluent pH is determined to be a function of the amount of etchant treated and the feed copper concentration.

To predict the effluent pH, a two-step calculation is needed where first, the number of bed volumes is determined, followed by determining of the feed concentration.

Figure 11:
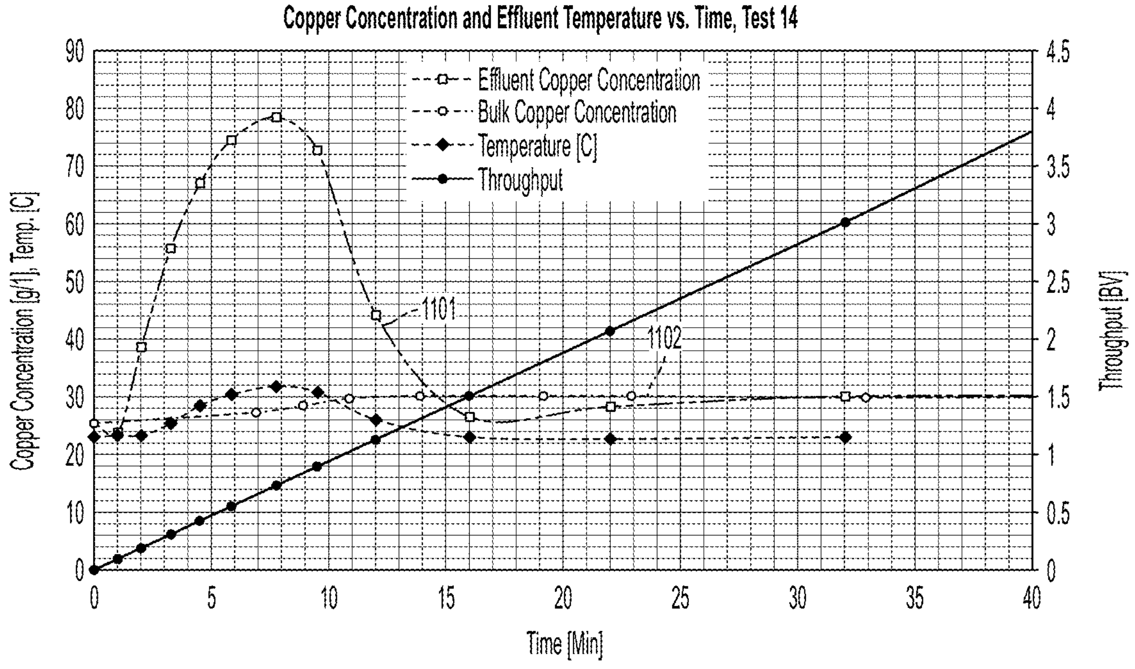
FIG. 11 illustrates a graph depicting the copper concentration, effluent temperature and time for the desorption process.
Figure 13:
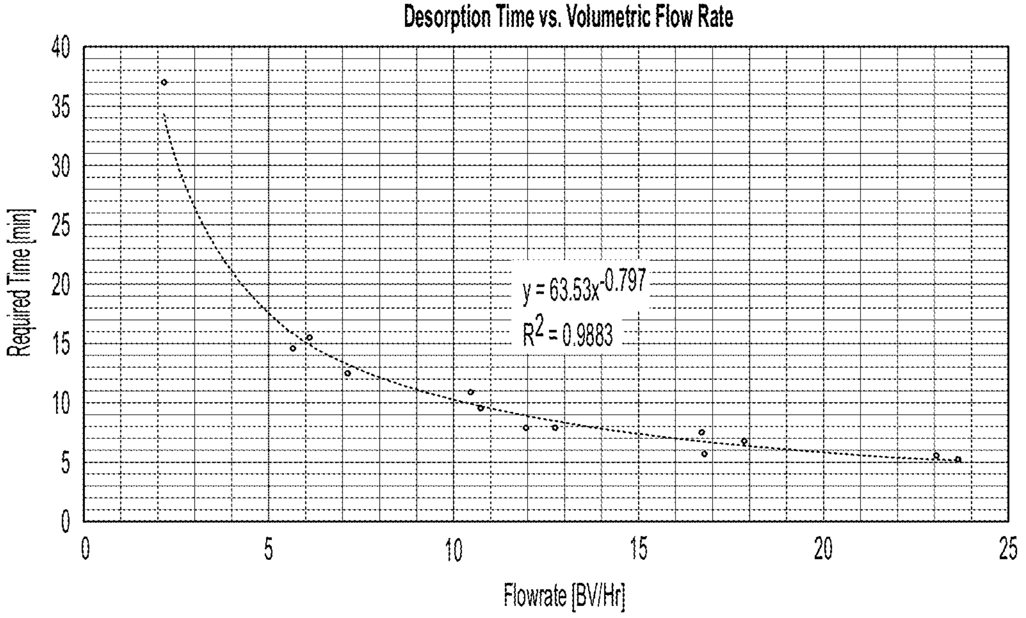
FIG. 13 illustrates a graph comparing the desorption time to the volumetric flow rate.

With reference to the desorption process, each desorption test followed similar trends, with the only difference being the time to complete the desorption. FIG. 11 depicts the copper concentration in the electrolyte, such as the sulfuric acid electrolyte, the effluent temperature and the time for desorption. During experimental testing, every test except one had a point where the effluent copper concentration 1101 passed below the bulk and/or feed copper concentration 1102. At this point, all copper has been removed from the resin column 201. This point was not captured in test twelve because samples were not collected close enough to where the dip occurred. The desorption time and volumetric flow rate through the column were compared by the experimenters by manually collecting (e.g., manually reading) the point of intersection between the effluent and bulk copper concentration curves. Desorption time with respect to the volumetric flow rate data of the column is valuable in desorption. For example, Table 4 in FIG. 12 describes desorption time 1214 with respect to varying target flow rates 1211. The flow types 1210 are classified based on the target flow rate 1211. The flow classifications included in the table, for example, are "Low", "Mid-Low", "Mid", "Mid-High" and "High". Other terms may be used to characterize the flow classifications. The table further discloses the required time for desorption 1214 based on a flow rate and taking into consideration the feed copper concentration 1212 to determine the end copper concentration 1213. FIG. 13 illustrates a graph with respect to the required time for desorption and variances in flow rate.

The temperature of the effluent stream may also be monitored. According to the monitored tests, the temperature of the effluent stream increased as copper was desorbed. Chloride concentration was measured only for the bulk samples, due to the limitations in lab testing. Each test ended with a higher end chloride concentration than the concentration from the beginning of the test. During desorption, the free acid concentration decreased as protons were left in the resin and replaced with copper in the solution, as determined through Equations 5 and 6. The total sulfuric concentration in the solution reduced slightly in each test which is unexpected as the value is generally expected to remain constant throughout testing. The slight drop may be a result of some dilution from water trapped in the resin. Additionally, specific gravity dipped slightly before increasing over the feed amount for every test. This again indicates that some dilution was present, as the specific gravity of the electrolyte should generally only increase as copper is drawn into the solution.

Figure 14:
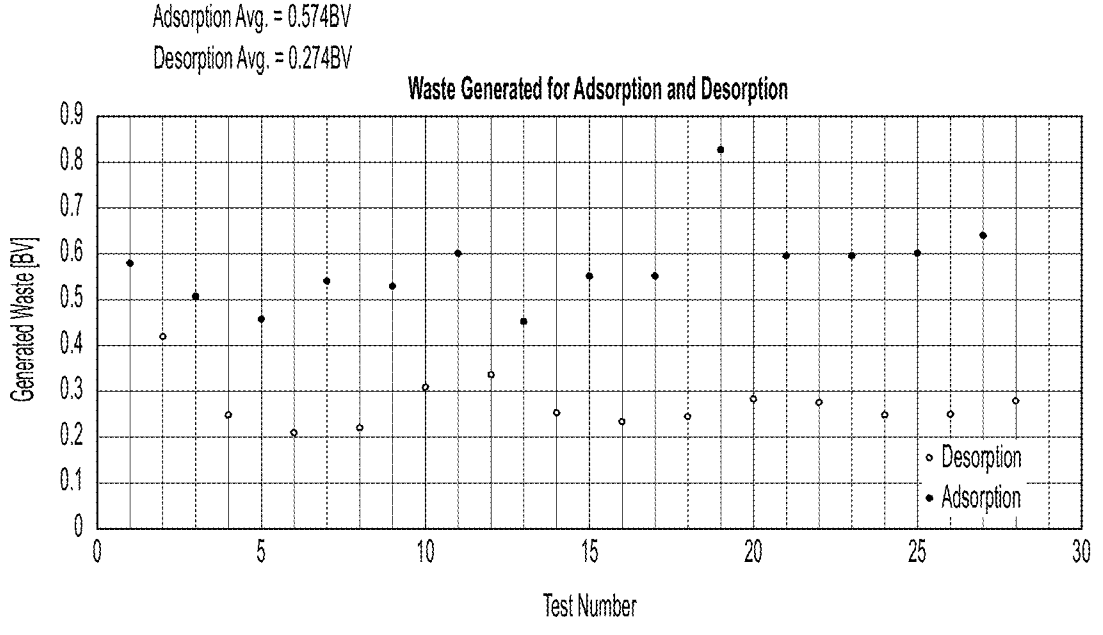
FIG. 14 illustrates a graph with measurements of the amount of discarded waster generated during adsorption and desorption.

It is also important to consider the amount of waste when designing a real system. The amount of water generated during operation must be considered as it can put strain on the PCB fabricator's waste treatment system. This can generally apply in cases where the fabricator operates with zero liquid discharge. FIG. 14 illustrates a chart capturing values associated with the generated waste during the desorption and adsorption at the various flow rates. Based on these values, the average adsorption value for the generated waste is 0.574 BV and the average desorption value for the generated waste is 0.27 BV. The major source of waste generation is from discarding diluted etchant and electrolyte. The initial effluent liquid is found to be heavily diluted by residual water trapped in the resin. During the experimentation testing, the amount of discarded waste generated for each test was measured and recorded.

The analysis of the adsorption data further indicates that there are two steps when controlling or predicting the amount of copper that is removed from a bulk volume of etch. First, is resin column (101, 201) size. Given a constant amount of etchant, a large resin column will result in fewer bed volumes of etchant being processed by the column. This will result in more copper being pulled from the bulk. Inversely, a smaller column will result in more bed volumes of etchant being processed by the resin column given the same etchant volume. Once the column size is set, the initial copper mass flow rate can be adjusted by changing the feed copper concentration or the volumetric flow rate through the resin column. Increasing the feed copper concentration or flow rate will increase the amount of copper that can be pulled from the etchant while decreasing can result in less copper being removed from the etchant. This is indicated in the graph chart of FIG. 10 and demonstrates that the feed concentration is dependent on how much of the copper is dissolved into the etchant which is a function of how much the etcher is used. Therefore, the inlet mass flow rate can be controlled by adjusting the volumetric flow rate through the resin. As such, the analysis of the adsorption data further proves that the resin is 2) effective in removing the copper form the etchant and 2) predictable and controllable.

The desorption process is simpler than the adsorption process. As the goal of desorption is to remove the copper from the resin as quickly as possible, desorption time plays a valuable role in the process. The results and evaluation of the desorbing data proved that desorption time is valuable in the desorption process with respect to the target flow rates. Determining of a desorption time required for desorbing is based on flow rate. Equation 10 uses an $R^2$ value of 0.9883 to determine the desorption time.

$$\text{Time} = 63.53[\dot{Q}]^{-0.797} \quad \text{Equation 10}$$

Where Time is in Minutes and Flow Rate is in Bed Volumes Per Hour

As the volumetric flow rate approaches zero, the desorption time goes to infinity. Inversely, as the volumetric flowrate goes infinitely fast, the desorption time approaches zero. Desorption time was only found to be a significant function of volumetric flow rate and not a function of copper concentration or free-acid concentration.

The amount of waste generated with respect to the desorption process must also be considered as indicated in FIG. 14. The amount of waste generated from discarding diluted acid and etchant is carried out manually and is based on color of the effluent stream. The desorption data indicates that acid electrolyte was diluted although the initial effluent liquid is discarded. Factors to consider include whether sufficient liquid is discarded thereby affecting the desorption data points collected. In most cases, the amount of waste generated in the desorption process is equal to the amount generated in the adsorption process. As with the adsorption process, this waste generation will also have to be considered when designing a real system with respect to the PCB fabricator's waste treatment system. Regeneration and recycling of waste is an important factor to consider with respect to the environment as well.

Figure 16:
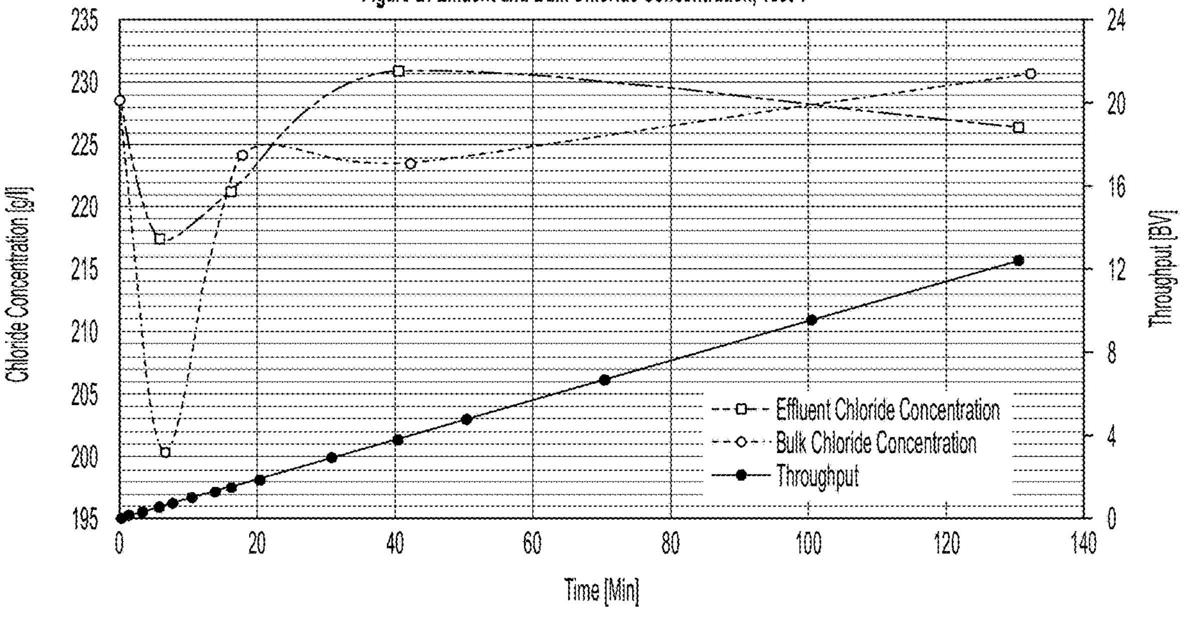
FIGS. 16 illustrates a graph chart describing the chloride concentration during absorption with respect to the time associated with the throughput.
Figure 17:
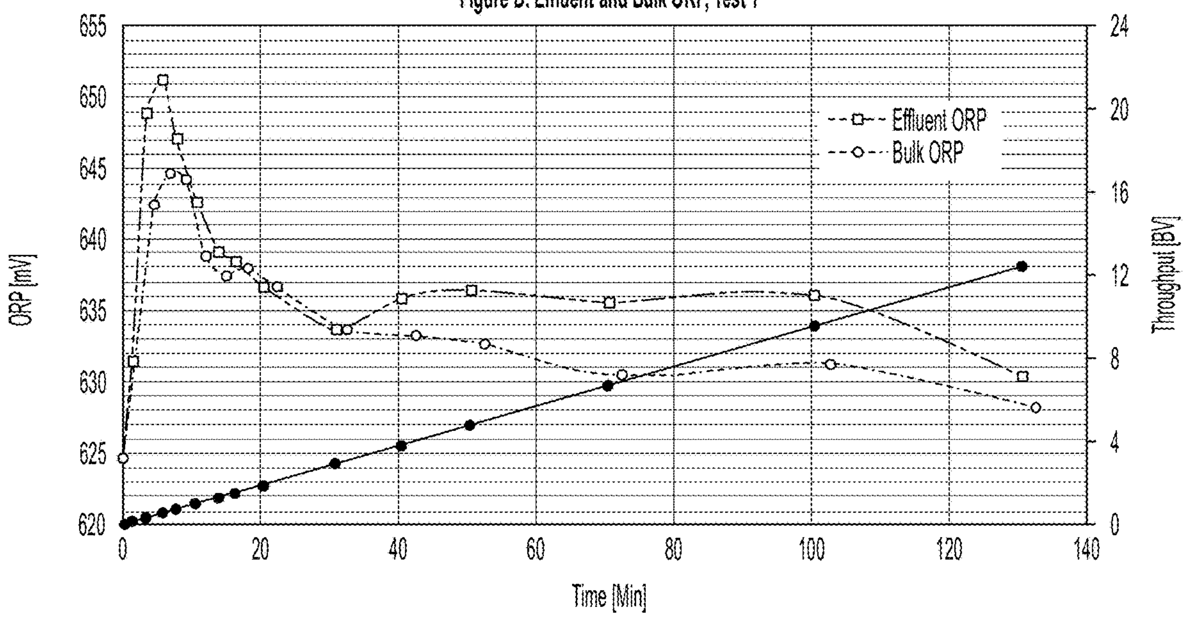
FIG. 17 illustrates a graph chart describing the ORP with respect to the time associated with throughput.
Figure 18:
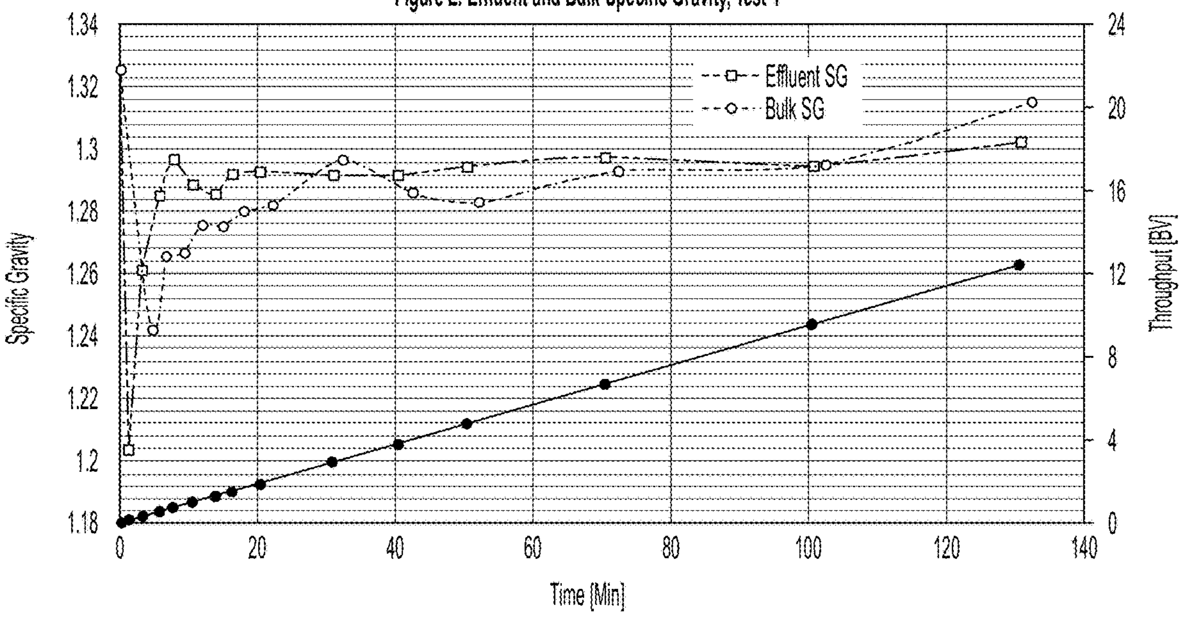
FIG. 18 illustrates a graph chart describing specific gravity with respect to the time associated with throughput.
Figure 19:
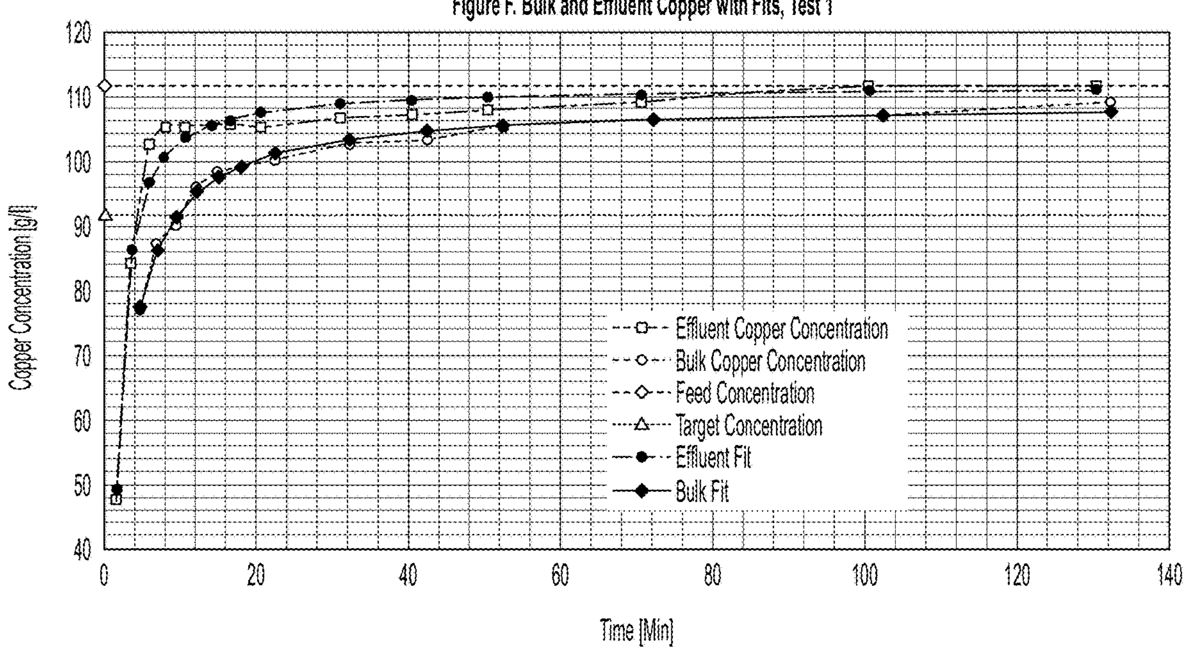
FIG. 19 illustrates a graph chart describing copper concentration with respect to time for different categories of copper.
Figure 22:
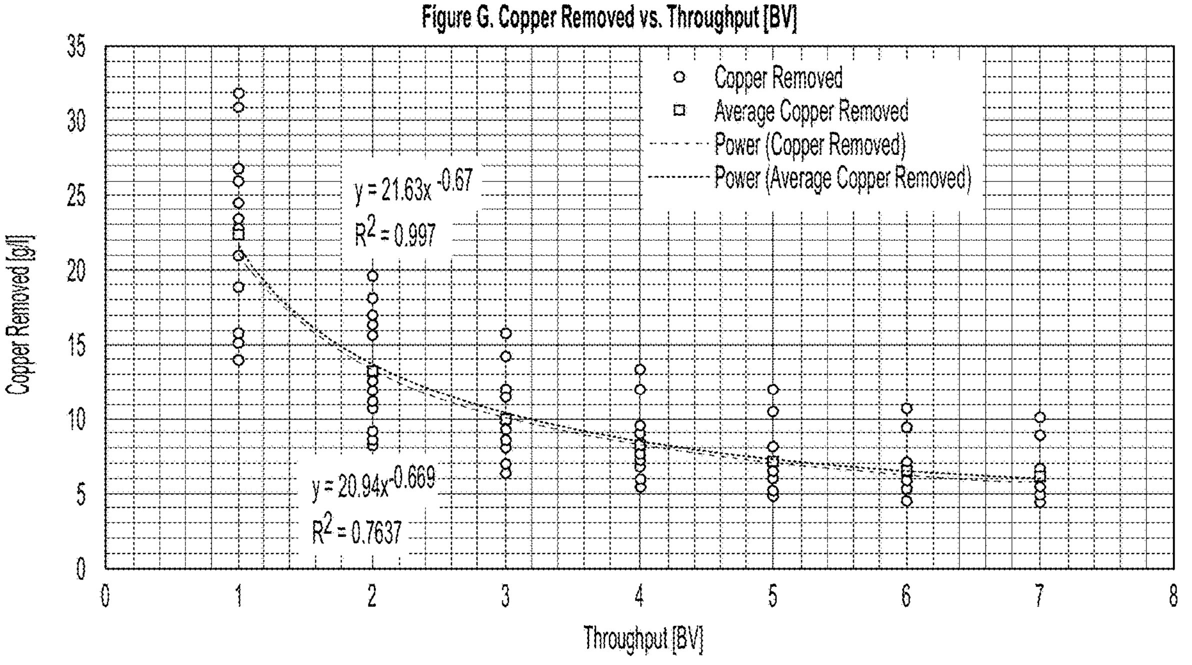
FIG. 22 illustrates a graph chart describing the copper removed with respect to throughput.
Figure 23:
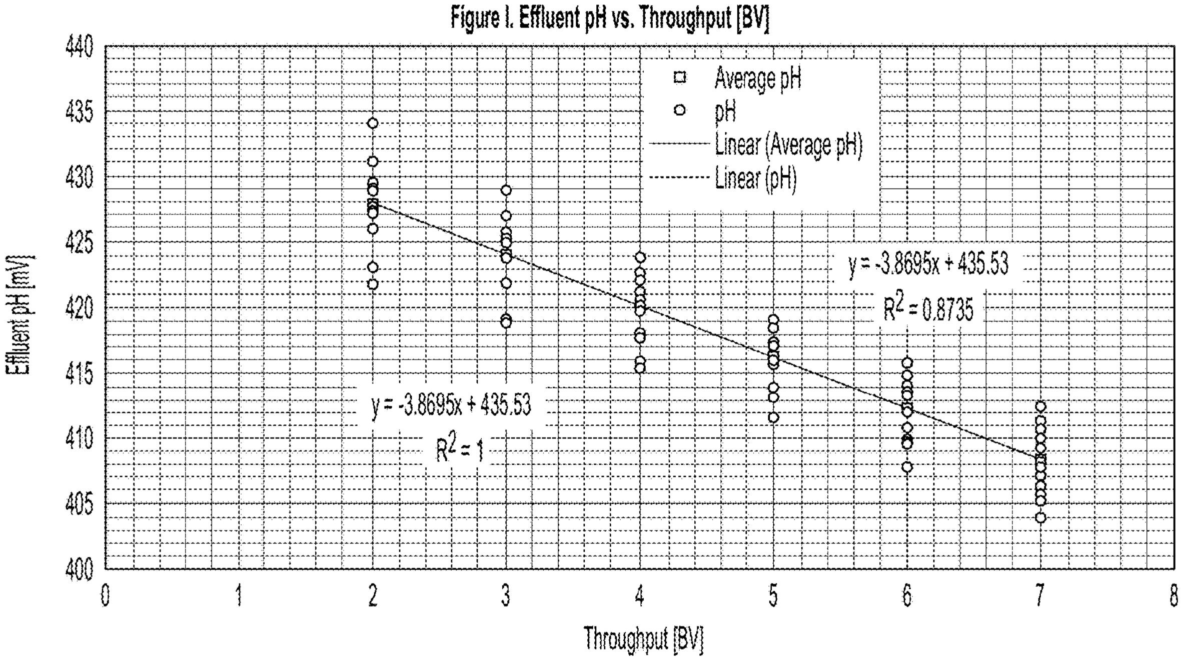
FIG. 23 is a graph chart describing effluent pH with respect to throughput.
Figure 24:
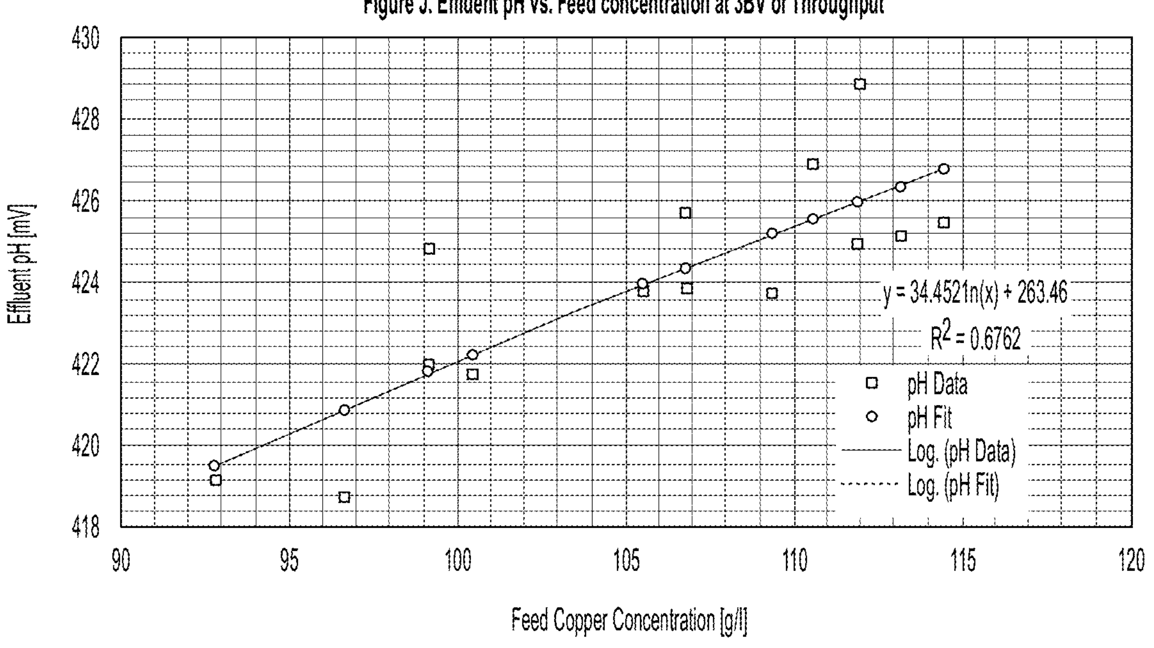
FIG. 24 illustrates a graph chart describing effluent pH with respect to feed concentration.
Figure 25:
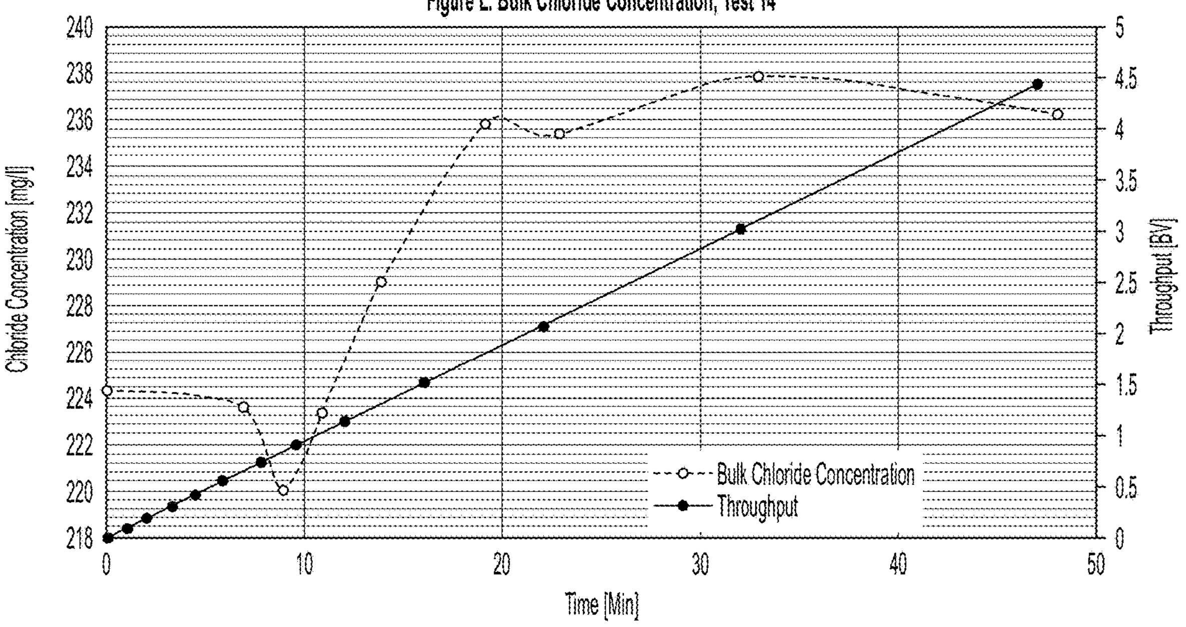
FIG. 25 illustrates a graph chart describing the chloride concentration with respect to time and throughput.
Figure 26:
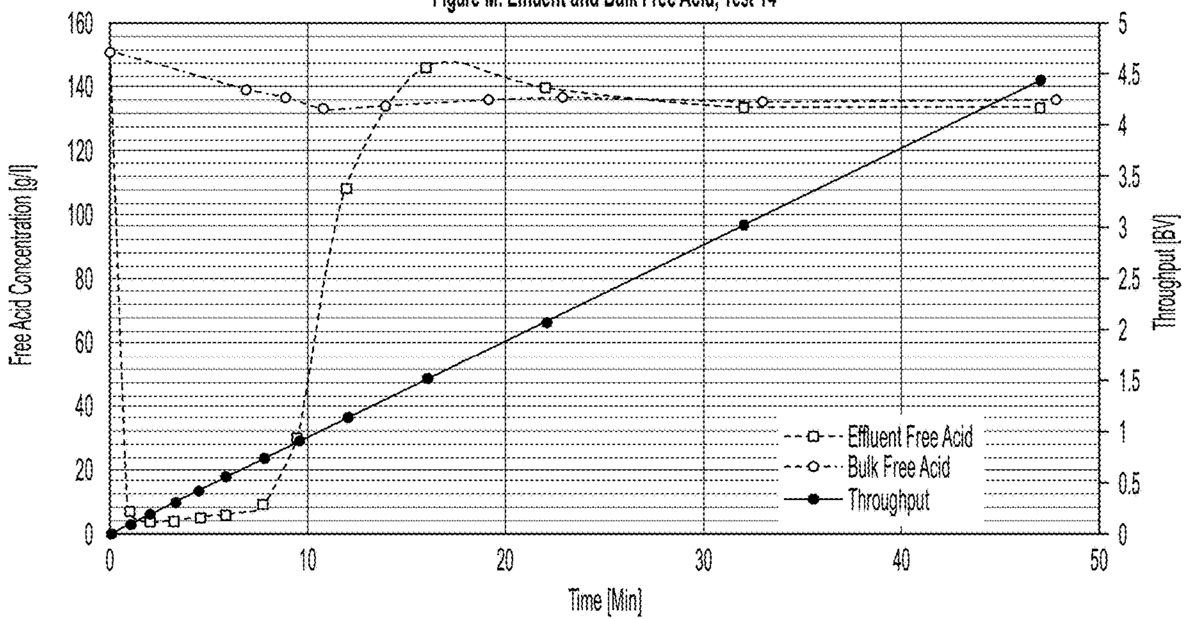
FIG. 26 illustrates a graph chart describing the free acid concentration with respect to time and throughput.
Figure 27:
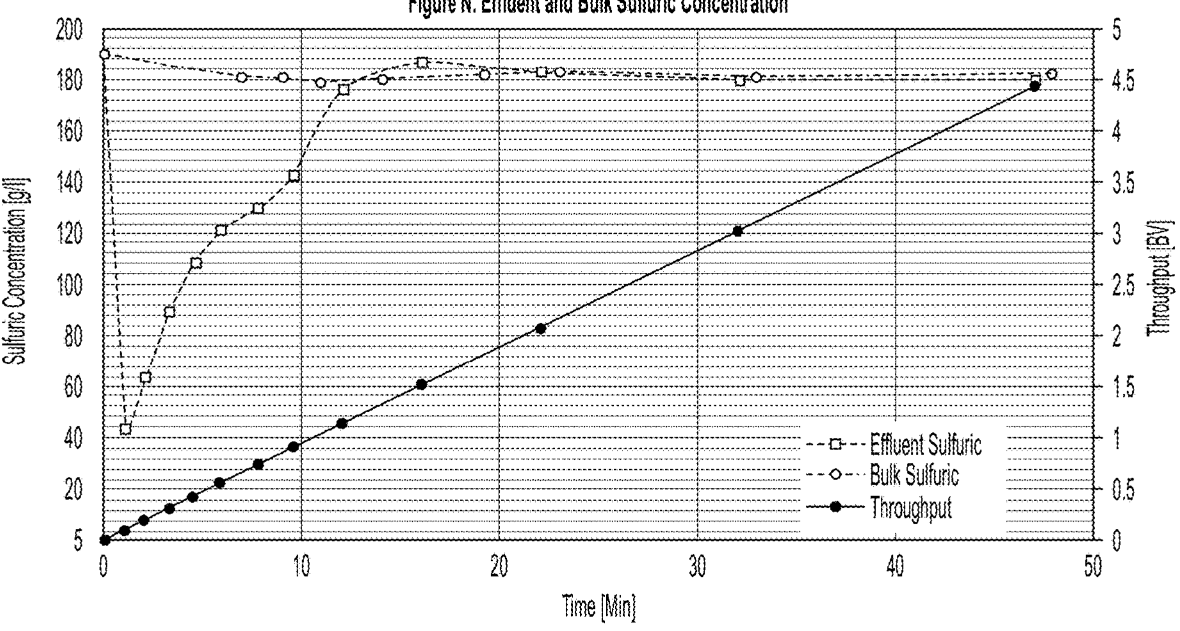
FIG. 27 illustrates a graph chart describing sulfuric concentration with respect to time and throughput.
Figure 28:
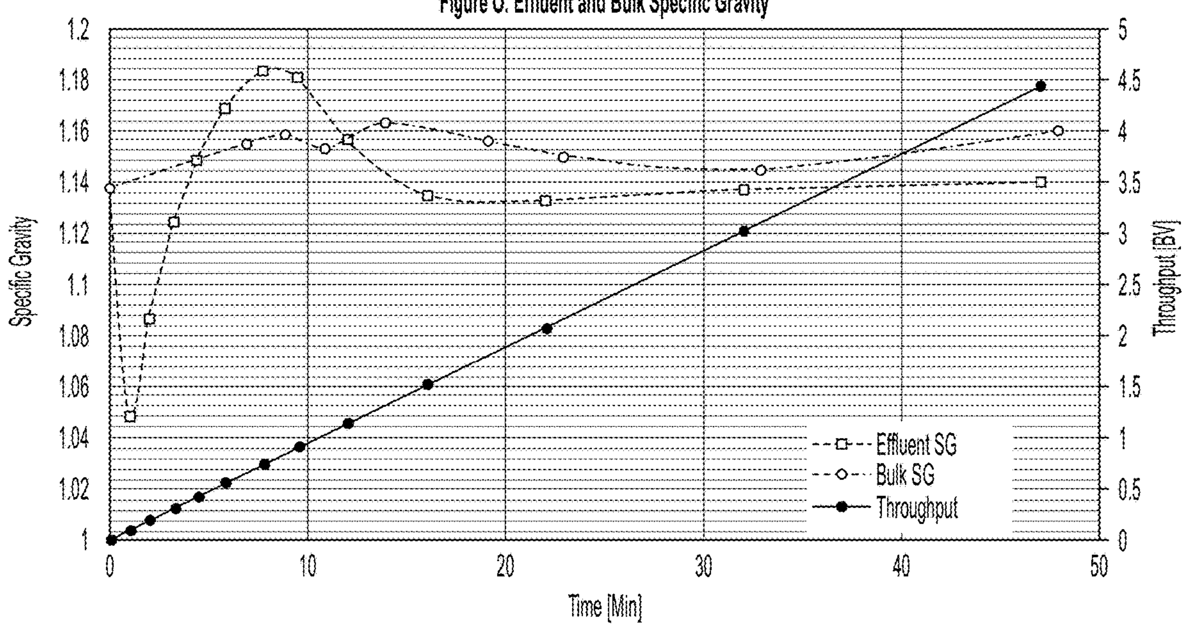
FIG. 28 illustrates a graph describing specific gravity with respect to time and throughput.

Additional details on the results of the testing performed with respect to the system and method described herein are shown in the tables and graphs included in FIGS. 15-29. These figures describe additional results regarding the embodiments described herein. FIG. 15 is a table providing an overview of the details and results of exemplary testing with respect to the adsorption process and desorption process. FIGS. 16 is a graph chart that describes the chloride concentration during absorption with respect to the time associated with the throughput. FIG. 17 is a graph chart that describes the ORP with respect to the time associated with the throughput. FIG. 18 is a graph chart that describes specific gravity with respect to the time associated with the throughput. FIG. 19 is a graph chart that describes copper concentration with respect to time for different categories of copper. FIG. 20 is table that describes copper and pH fits for adsorption data. FIG. 21 is a table the describes the mounts of copper removed from 1BV to 6BV of etchant. FIG. 22 is a graph chart that describes the copper removed with respect to throughput. FIG. 23 is a graph chart that describes effluent pH with respect to throughput. FIG. 24 is a graph chart that describes effluent pH with respect to feed concentration. FIG. 25 is a graph chart that describes the chloride concentration with respect to time and throughput. FIG. 26 is a graph chart that describes the free acid concentration with respect to time and throughput. FIG. 27 is a graph chart that describes sulfuric concentration with respect to time and throughput. FIG. 28 is a graph that describes specific gravity with respect to time and throughput. FIG. 29 is a table that describes desorption time with regard to flow rate.

The embodiments disclosed herein and the collected data further indicates that it is feasible to remove copper, including copper ions from etchants, such as the acidic cupric etchant using an ion-exchange resin. The resin can remove a significant amount of copper from a volume of etchant larger than the volume of the resin and by avoiding costly and hazardous organic solvents. The amount of copper that can be removed from the etchant is a function of 1) the volume of etchant treated and/or the size of the resin column and 2) the specific initial mass flow rate of copper through the column as indicated in the data of the graph of FIG. 10. Optimization to remove additional amounts of excess copper from the etchant is possible through additional calculations. Desorption of copper from the ion-exchange resin with sulfuric acid electrolyte is also proven feasible with the data collected. The data further indicated that the time required to desorb copper from the resin was found to be a function of the volumetric flow rate of the acid electrolyte.

The ion-exchange process proves to serve well for extractions, and is advantageous over liquid-liquid extractions which rely on hazardous organic solvents. Additionally, these solvents are expensive, need to be dosed frequently and require a large overhead for disposal, especially when dealing with thousands of liters of hazardous liquids. The ion-exchange resin provides a safe and non-hazardous solid which when necessary, can be disposed of without concerns for environmental damage. This proves to be an important benefit for solvent free copper extraction using ion-exchange resins. Furthermore, although the systems and processes described herein have focused on copper removal, it is understood that these systems and processes may be used for removal of other metals or substances, or indeed other purposes. In example embodiments, the systems and processes described herein may be used to target contaminated metal remove from chemical baths (i.e. remove contaminate iron from a plating bath); target removal of hazardous compounds to protect other processes (i.e. removal of halogens before a plating process); and regenerate other chemical baths for reuse without having to completely remake the bath.

What is claimed is:

1. A method comprising:

causing etchant to flow through a resin column comprising resin, the resin column removing less than an entire amount of copper from the etchant to create regenerated etchant, wherein the amount of copper removed from the etchant is a function of:

a volume of the etchant treated, a size of the resin column, and an initial mass flow rate of the etchant through the resin column;

desorbing, using sulfuric acid electrolyte, an amount of copper from the resin;

determining an inlet mass flow rate of the copper based on a value corresponding to a volumetric flow rate, volume of the resin, and feed copper concentration;

determining, based on at least the amount of copper from the resin and the inlet mass flow rate, an effectiveness of the resin column in removing the amount of copper from the etchant; and applying the regenerated etchant to one or more subsequent etching processes.

2. The method of claim 1, wherein the resin comprises an ion-exchange resin, wherein the resin column adsorbs copper ions from the etchant using the ion-exchange resin and releases protons into the etchant to maintain a charge balance.

3. The method of claim 2, wherein a type of the resin is chosen based at least on one factor related to a pH value associated with adsorption of copper ions.

4. The method of claim 3, wherein the removing of the copper and the releasing of the protons increases the pH value of the etchant.

5. The method of claim 3, wherein a specific gravity of the etchant drops in response to the removal of the copper.

6. The method of claim 1, wherein desorbing the extracted copper comprises:

removing copper ions from the resin, wherein protons remain in the resin.

7. The method of claim 1, wherein a flow of etchant through the resin column is caused by a pump.

8. The method of claim 7, further comprising:

treating the resin column by air purging, rinsing with water, followed with air purging.

9. The method of claim 1, wherein a temperature of the etchant changes during adsorption.

10. The method of claim 1, wherein the amount of copper removed from the etchant is based on volumetric flow rates through the resin and feed copper concentrations.

11. The method of claim 1, wherein time required to desorb the extracted copper from the resin is based on a function of the volumetric flow rate of the sulfuric acid electrolyte.

12. The method of claim 1, wherein the etchant comprises at least cupric copper.

13. The method of claim 1, wherein the amount of copper that is removed is calculated from the formula:

$$\dot{M} = \left[\frac{\text{Feed Concentration}\left[\frac{\text{g}}{\text{l}}\right] * \text{Volumetric Flow Rate}\left[\frac{\text{l}}{\text{Hr}}\right]}{1000\left[\frac{\text{g}}{\text{kg}}\right] * \text{Resin Volume [l]}}\right]$$

* * * * *